US006229595B1

(12) United States Patent
McKinley et al.

(10) Patent No.: US 6,229,595 B1
(45) Date of Patent: *May 8, 2001

(54) LITHOGRAPHY SYSTEM AND METHOD WITH MASK IMAGE ENLARGEMENT

(75) Inventors: William G. McKinley, Littleton; Gerard M. Perron, Acton; Berge Tatian, Stoneham, all of MA (US)

(73) Assignee: The B. F. Goodrich Company, Charlotte, NC (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/439,951

(22) Filed: May 12, 1995

(51) Int. Cl.[7] .................................................. G03B 27/42

(52) U.S. Cl. ............................................................ 355/53

(58) Field of Search .................................. 355/52, 53, 55, 355/57, 66, 67, 71, 72, 77

(56) References Cited

U.S. PATENT DOCUMENTS

| 4,302,079 | 11/1981 | White ...................... 350/371 |
|---|---|---|
| 4,346,164 | 8/1982 | Tabarelli et al. .................. 430/311 |
| 4,391,511 | 7/1983 | Akiyama et al. .................. 355/40 |
| 4,475,223 | 10/1984 | Taniguchi et al. ................. 378/34 |
| 4,504,045 | 3/1985 | Kenbo et al. ..................... 269/21 |
| 4,509,852 | 4/1985 | Tabarelli et al. .................. 355/30 |
| 4,666,291 | 5/1987 | Taniguchi et al. ................. 355/52 |
| 4,769,860 * | 9/1988 | Resor, III et al. ................. 355/43 |
| 4,947,413 | 8/1990 | Jewell et al. ..................... 378/34 |
| 4,974,919 | 12/1990 | Muraki et al. .................... 350/6.6 |
| 5,008,702 * | 4/1991 | Tanaka et al. ..................... 355/53 |
| 5,117,255 * | 5/1992 | Shiraishi et al. ................... 355/53 |
| 5,162,844 * | 11/1992 | Ueda ................................ 355/67 |
| 5,170,207 * | 12/1992 | Tezuka et al. ..................... 355/53 |
| 5,184,176 * | 2/1993 | Unno et al. ....................... 355/52 |
| 5,220,590 | 6/1993 | Bruning et al. .................... 378/34 |
| 5,257,139 | 10/1993 | Higuchi ........................... 359/859 |

(List continued on next page.)

FOREIGN PATENT DOCUMENTS

0608572A3 12/1993 (EP) .
62-122126 6/1987 (JP) .

OTHER PUBLICATIONS

Betz, H., et al., "Possibility of enlarging x–ray exposure area with x–ray mirror or by electron beam vertical motion," pp. 83–92.

Offner, A., "New Concepts in Projection Mask Aligners," *Optical Engineering*, 14(2):130–132, (Mar.–Apr. 1975).

Bieber, M., et al., "Investigation Of X–Ray Exposure Using Plane Scanning Mirrors," *Nuclear Instruments and Methods*, pp. 281–286, (1983).

Tatian, B., "Nonrotationally Symmetric Systems: A New Problem for Optical Design and Fabrication," pp. 205–219.

Tatian, B., "Testing an unusual optical surface," *SPIE*, vol. 554, International Lens Design Conference, (1985), pp. 139–147.

Primary Examiner—Fred L Braun
(74) Attorney, Agent, or Firm—James M. Rashid

(57) ABSTRACT

A photolithography system includes a light source and illumination optics which receive light from the light source and project illumination light onto a mask. Light transmitted through the mask is received by projection optics which generate an enlarged image of the mask. The enlarged image is projected onto the surface of a substrate such as a semiconductor wafer or flat panel display. The system achieves a wafer or panel feature size of less than 10 μm, preferably 3 μm, while enlarging the image of the mask to produce large wafers and panels in a single exposure. A deformable substrate chuck is selectively deformable to ensure a flat substrate surface. An alignment subsystem ensures precise registration between exposure layers.

15 Claims, 13 Drawing Sheets

U.S. PATENT DOCUMENTS

| | | | |
|---|---|---|---|
| 5,285,236 | * 2/1994 | Jain | 355/53 |
| 5,298,939 | * 3/1994 | Swanson et al. | 355/53 |
| 5,309,198 | 5/1994 | Nakagawa | 355/67 |
| 5,315,629 | 5/1994 | Jewell et al. | 378/34 |
| 5,353,322 | 10/1994 | Bruning et al. | 378/34 |
| 5,363,170 | 11/1994 | Muraki | 355/67 |
| 5,559,629 | * 9/1996 | Sheets et al. | 355/53 |

\* cited by examiner

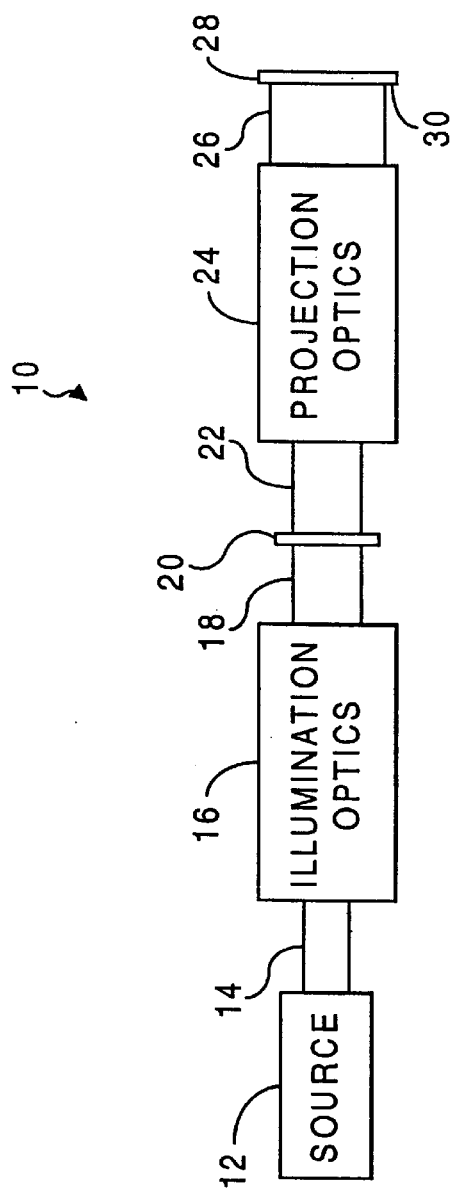
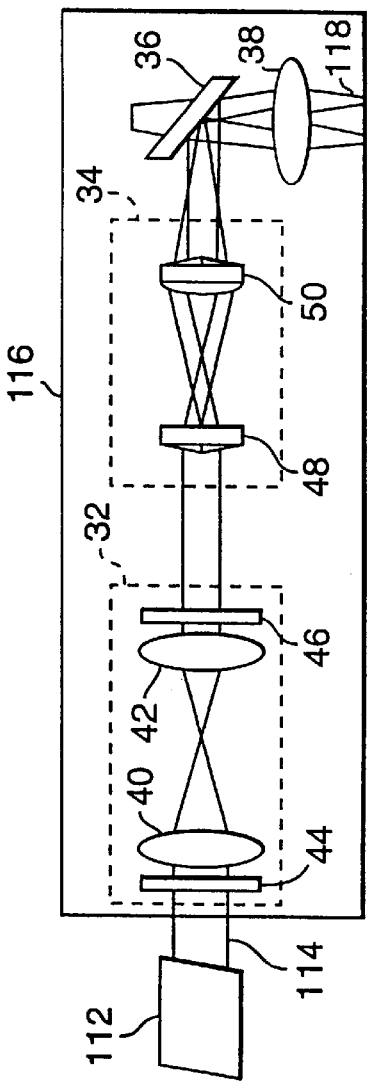
FIG. 1
FIG. 2

LITHOGRAPHY SYSTEM AND METHOD WITH MASK IMAGE ENLARGEMENT

BACKGROUND OF THE INVENTION

In conventional lithography systems, patterns are formed on a substrate such as a semiconductor wafer or flat panel display by projecting light through a patterned mask onto the surface of the substrate which is coated with a thin film of photoresist. After the photoresist is thus exposed by the patterned light, it is developed to form the mask pattern on the surface of the substrate in the form of a pattern of hardened photoresist. The wafer or panel is then subjected to a particular desired microfabrication step such as chemical vapor deposition, ion implantation, oxidation, metal deposition, etc.

In the semiconductor and flat panel display industries, it is highly desirable to fabricate very complex circuit patterns on very small surface areas. Hence, lithography systems which can produce very small feature sizes are in great demand. To achieve small feature sizes, conventional lithography systems include an optical projection subsystem located between the mask and the substrate surface which demagnifies or reduces the image of the mask and projects the reduced image onto the surface of the substrate. By reducing the image of the mask, very small feature sizes, or, equivalently, very high resolution, can be achieved, thus enabling the system to achieve very high circuit densities.

As circuit complexities and panel sizes have increased and feature sizes have decreased, it has become commonplace to use several masks to produce a pattern on the substrate surface, with each mask forming the pattern for a single particular portion of the overall pattern. In these systems, the entire pattern is formed by a series of separate individual exposure steps, each with a different mask in a different position. That is, in a first step, a mask is installed in the system, the substrate is located such that the reduced image of the mask will be projected onto the substrate where it is desired to produce the particular associated portion of the overall pattern, and the exposure is carried out. Next, the mask is replaced with a second mask used to produce a second portion of the overall pattern. The substrate is moved to a new position where the second portion of the pattern is desired, and the second exposure is completed. This process continues until the entire pattern is exposed by all of the required masks.

There are several drawbacks to this "step-and-repeat" approach. First, the individual portions of the overall pattern must be precisely aligned with each other laterally along the surface. The process of aligning the individual portions, commonly referred to as "stitching", can be extremely difficult, time-consuming and expensive. Features such as conductive lines can be extremely narrow, for example, on the order of 10 $\mu$m. Where such a line crosses the boundary between two portions of the pattern, it must be aligned so that continuity is not interrupted. It is a standard industry requirement that when portions of a pattern are stitched together, they must be aligned within 10% of feature widths. Hence, with a 10 $\mu$m line width, the features must be aligned within 1 $\mu$m. Such high accuracy alignment is very difficult to achieve.

Even if the individual portions can be accurately spatially stitched, other inaccuracies can also be introduced. For example, due to the sensitivity of commonly available photoresists, feature size is affected by exposure time and source luminance. Therefore, because of slight inaccuracies in the light source and/or optics of conventional systems which result in varying luminance and exposure time, the sizes of features can vary from portion to portion along the pattern. This can also degrade performance of the final circuit.

Thus, it will be appreciated that forming complex patterns on large substrates such as semiconductor wafers, multichip modules and flat panel displays can be very time-consuming and, hence, very expensive. Each wafer or panel requires several pattern layers, and each pattern layer can require several masks. The masks themselves are very expensive, as are the lithography and microfabrication processes which use them. As larger panels and/or wafers requiring higher resolution are demanded, these costs will continue to rise.

One alternative to the stitching approach has been used in some systems to produce relatively large approximately ten inch diagonal flat panel displays. In these systems, a special full-sized mask is produced with the pattern for an entire panel exposure layer. The mask is placed in close proximity to the flat panel with subaperture projection optics between them. The exposure is performed in either a line or area scanning procedure in which the exposure light is scanned over the panel in a line-by-line or in serpentine fashion until the entire pattern is exposed.

This approach also has several drawbacks. First, the special large mask is very expensive to produce. At the present time, most mask manufacturers are not equipped to produce such large masks, and those that will produce them charge very high premiums. Also, the scanning exposure process can be very time consuming, causing low panel throughput.

In other lithography applications, multiple small identical patterns can be formed on a substrate by repeated exposures, with each exposure creating one pattern or a small subset of the required patterns. These applications include small semiconductor circuits such as transistors and flat panel display pixel circuits. In either case, a typical substrate will have many such circuits formed in a repeating pattern over the entire substrate surface. Although stitching between individual patterns may not be required, this step-and-repeat process can also be very time-consuming and expensive especially where large numbers of patterns are exposed one at a time.

SUMMARY OF THE INVENTION

The present patent application describes multiple inventions in the field of lithography and substrate processing and microfabrication where the substrate can be a flat panel display, a semiconductor wafer, a multichip module, etc. One invention is directed to a lithography system and method which has very high resolution and therefore can produce very small feature sizes while producing relatively large patterns using relatively small preferably standard sized masks. The present invention is directed to a lithography system and method in which the image of the mask is enlarged, instead of reduced, as it is projected onto the surface of a substrate. The system includes a source such as a light source and illumination optics which illuminate the mask with light from the light source. Projection optics having one or more optical elements receive light transmitted through the mask and project an enlarged image of the mask onto a surface of the substrate. The projection optics achieve high resolution and other advantageous features of the invention by including at least one optical element which has a curved surface having a non-conic shape. The term conic as used herein refers to a conic of revolution, e.g., ellipsoid, hyperboloid, paraboloid and sphere.

In one preferred embodiment, the projection optics comprise a plurality of non-ellipsoidal powered mirrors. The mirrors can be a combination of elements having spherical, conic, aspheric or unusual shapes.

In one preferred embodiment, the projection optics include at least one device having an aspheric shaped surface described by a polynomial for a conic section with additional terms defining non-zero surface deformations from the conic section shape. Such surfaces can be either rotationally symmetric or non-rotationally symmetric, depending on the desired result. The optical device having such a surface can be either reflective or refractive and the projection optics can include more than one such device.

In another preferred embodiment, the projection optics include at least one device having a curved unusual surface which may be rotationally symmetric or non-rotationally symmetric, depending on the desired result. The device can be reflective or refractive, and the projection optics can include more than one such device.

The projection optics can be catadioptric, that is, they can include a combination of reflective and refractive optics, or they can be dioptric, that is, consisting of only reflective elements. One preferred catadioptric system includes plural reflective and refractive elements having surfaces with non-zero deformation from conic shape. A preferred dioptric system includes four mirrors, each having an unusual surface. One embodiment includes a combination of unusual surfaces and aspherically deformed conics.

In one embodiment, the projection optics include a distortion corrector for removing distortion from the image projected onto the mask. Also, the projection optics can preferably include an astigmatism corrector for eliminating astigmatism from the system.

The projection optics provide the system with a wide projection angle to permit high mask magnification and large mask image sizes at the surface of the substrate. The projection optics also preferably project the image telecentrically onto the substrate. Telecentricity helps eliminate distortion in the image. If the distance between the substrate and the projection optics should fluctuate, the telecentric nature of the optics prevents the magnification from introducing line separation distortion. Telecentricity also gives the system a larger depth of field. Fluctuations in the distance between the optics and the substrate are less likely to take the image out of focus.

The projection optics of the invention also provide the system with very high resolution, i.e., very small feature size and line width, while providing mask image enlargement. In one preferred embodiment, the system achieves a line width below 10 $\mu$m. One particular embodiment is used to produce a line width of 3 $\mu$m. This resolution makes the system of the invention applicable to both semiconductor fabrication and flat panel display fabrication technologies.

A typical flat panel active matrix liquid crystal display (LCD) for a lap top computer has a resolution of 640×480 pixels at a diagonal dimension of approximately 10.4 inches. At the present time, these panels are exposed in photolithographic processes by one of three standard techniques. In the first technique, each pattern layer is formed by exposing plural masks, one at a time at particular predetermined locations along the substrate, and the exposure images are stitched together. Typically, such systems include projection optics between the mask and the substrate which reduce the mask image to achieve the desired feature size and line width.

In another technique, a full-sized mask is generated with an entire layer pattern formed over the mask. In this technique, there is a one-to-one size correspondence between the mask and the panel pattern. Under this technique, the exposure can be carried out by one of two different processes. A line scanning process can be used in which a light source such as a laser beam is swept across the mask in a raster fashion side-to-side and top-to-bottom. In other systems, an area scanning process is used in which a light source and lens on opposite sides of the mask are simultaneously scanned in a serpentine fashion to sweep an exposure area over the entire mask.

In these one-to-one systems, the special large (10.4 inch diagonal) masks are extremely expensive and difficult to manufacture. In a typical display requiring 10 to 20 pattern layers, the cost of a mask set can be prohibitive. In the present invention, a standard 6 or 7 inch mask with the entire panel layer pattern formed thereon can be used. The patterned exposure light transmitted through the mask is enlarged to produce the final exposure image. Since standard readily available mask sizes can be used, a mask set for a panel is far less expensive than the special large one-to-one panels used in some systems. Also, with the image enlargement of the invention, the exposure is carried out all at once with a single brief exposure. No stitching or scanning is required.

In addition to fabricating standard size displays, the lithography system of the invention can also be used to create much larger displays such as flat panel television screens with much higher pixel resolution. The invention is applicable to fabricating high-definition television (HDTV) displays having standard pixel dimensions of 1125×882 pixels at a size of 650 mm×550 mm. Even with a standard sized mask, these pixel resolutions can be obtained at a feature size of less than 10 $\mu$m, preferably approximately 3 $\mu$m. The narrow line width permits the LCD driver circuits to be fabricated along the borders of the display panel. It will be understood that the pixel resolutions mentioned are only examples. Any number of pixels can be achieved depending upon the mask pattern.

The system of the invention can also be used in fabrication of very large low-resolution displays, such as message boards for highways and airports. Using a standard sized or larger mask and a high enlargement factor, the system can produce these larger displays with a single exposure per pattern layer in a fashion similar to that used for high-resolution applications described above.

Another invention described herein is directed to an adjustable or deformable substrate holder or chuck used to hold and shape relatively flat workpieces and a method of holding and shaping such workpieces. To achieve uniform high resolution over relatively large panel or wafer pattern sizes, the lithography system of the invention can include such an adjustable or deformable chuck. In one preferred embodiment, the chuck is controllable to be selectively deformable to flatten the panel such that the entire surface of the panel is flat to within the depth of field of the lithography system.

The deformable chuck of the invention includes a deformable top mounting plate upon which the substrate is mounted by means such as vacuum or electrostatic attraction. The deformable mounting plate is supported by a plurality of deformable supports or variable-length members distributed in a two-dimensional array along the bottom of the deformable mounting surface. In the case of vacuum hold-down, the deformable mounting plate includes a chamber accessible via a vacuum pump port. The chamber can be partially evacuated to create a negative pressure in the chamber. The top surface of the deformable mounting plate is porous or is machined with channels. When the substrate is placed on the top surface and the vacuum is activated, the negative pressure in the chamber holds the substrate to the surface.

The chamber preferably includes plural regions defined by walls within the chamber. The walls can be arranged to position the regions in a predetermined pattern to optimize the vacuum hold down function. For example, the walls can be arranged to form multiple concentric annular regions. When the vacuum is activated, the region at the center of the chamber will pump down first since it has the smallest volume. The regions will successively pump down radially from the center. This ordering results in good contact between the substrate and the top surface of the mounting plate.

Each of the supports is individually addressable and controllable by an electrical signal to change its length and, therefore, change the height of the portion of the deformable mounting plate it supports. The deformable support can be a piezoelectric transducer which changes length in relation to an applied voltage. Each support can also be a combination of a piezoelectric transducer and a controllable servo motor coupled to a shaft which supports either the mounting plate directly or the piezoelectric transducer. By controlling the servo motor, the height of the shaft can be changed to deform the mounting plate. In one embodiment, the servo is used to perform coarse adjustments in combination with the piezoelectric transducer which is used to perform fine adjustments.

The deformable chuck operates under the control of a panel shape controller. The controller receives inputs from an optical panel surface sensor which in the preferred embodiment detects the flatness of the panel. The optical sensor preferably includes a light source and optical system which directs light from the light source through a Ronchi grating onto the surface of the substrate. Light returning from the substrate surface passes back through the Ronchi grating to generate a Moire fringe pattern. The optical sensor analyzes the Moire pattern which indicates the flatness of the panel surface. The sensor generates signals indicative of the flatness of the panel and forwards the signals to the panel shape controller. The controller translates the signals from the sensor into control signals used to selectively change the length of particular supports. As the support lengths are changed, the portions of the deformable top surface and the substrate are moved relative to each other to flatten the substrate surface as desired.

The system of the invention also includes an alignment system which aligns the substrate being exposed to the deformable chuck and also aligns the projected mask image with the substrate before exposure to ensure proper registration between exposure pattern layers. The top surface of the deformable chuck includes two charge-coupled device (CCD) pixel arrays located on the top surface so as to be positioned at opposite corners of the exposure pattern. The substrate, such as a transparent glass flat panel display, can have two opaque regions with transparent circular center regions located at the opposite corners of the pattern. The substrate is first placed over the top surface of the chuck such that the opaque regions mask the CCD pixel arrays. Before the exposure, the chuck with installed substrate are located under the projection optics. A source of light having a wavelength to which the photoresist is not reactive illuminates the mask and projects light from the mask onto the substrate. The mask is formed with two transparent circular regions in opposite corners of the pattern such that when the mask pattern is aligned with the substrate, two circular patterns of light will fall within the transparent regions of the substrate located over the CCD pixel arrays of the chuck. By reading data from the pixel arrays and moving the chuck appropriately, the exposure pattern can be aligned with the substrate. To eliminate contact with the CCD or to adjust CCD detector size, the CCD and panels may be coupled by reimaging optics. After the alignment is completed, the exposure light source is activated to expose the substrate.

In the system of the invention, the exposure of a panel can be considered a two-step process. In the first step, the deformable chuck is located in a panel flattening position. A standard panel loader loads a panel onto the chuck such that the opaque regions at its corners are in alignment with the CCD pixel arrays in the chuck. Also, at this first position, the panel flattening system is activated to flatten the panel as described above. After the panel is flattened, the chuck is moved to the exposure position under the projection optics. The process of aligning the mask to the panel is then carried out with the light source emitting light to which the photoresist is not reactive. After alignment of the mask to the panel, the process is completed by exposure of the panel with exposure light through the mask.

In a preferred embodiment of the lithography system of the invention, two substrates or panels can be processed simultaneously. To that end, the preferred embodiment of the invention actually includes two deformable chucks mounted at opposite ends of a movable slide system. While a first panel is being exposed on the first chuck, a second panel is being loaded onto the second chuck and flattened. After the first panel is exposed and the second panel is flattened, the slide changes positions such that the second panel can be aligned with the mask and then exposed. The first panel is simultaneously unloaded from the first chuck, and a third panel is loaded onto the first chuck and flattened. It will be appreciated that this simultaneous flattening and exposing process greatly enhances the system's panel throughput.

The enlarging lithography system of the invention provides numerous advantages over prior traditional lithography systems. By enlarging the image of the mask, the system of the invention can produce image patterns on large substrates using standard readily available mask sizes. In other one-to-one systems, large patterns are produced from large masks. Such masks are difficult and expensive to produce and, as such, are not readily available from commercial mask suppliers.

The system of the invention also provides the further advantage of producing large patterns on substrates with a single exposure. Prior systems make multiple exposures using multiple masks for each layer and then stitch the patterns together. Other systems have one-to-one mask-to-pattern relationships; however, these systems produce the exposure by line or area scanning. This can be time consuming and also introduces irregularities in feature size because of fluxuations in the source luminance. Because the system of the invention can produce a mask pattern with a single exposure, the system of the invention can produce panels at a much higher rate than prior systems. Panels having very high resolution, i.e., very low feature size, can be produced efficiently with high yields at a very high throughput.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 1 is a schematic diagram illustrating mask image enlargement in a photolithography system in accordance with the present invention.

FIG. 2 is a schematic diagram of one embodiment of the illumination optics of the present invention.

DETAILED DESCRIPTION OF THE INVENTION

Figure 3:
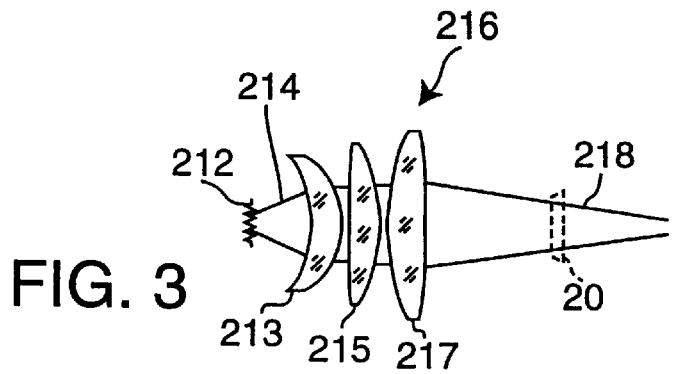
FIG. 3 is a schematic diagram of an alternative embodiment of the illumination optics of the invention.

FIG. 1 is a schematic block diagram of a photolithography system 10 in accordance with the present invention. The system 10 includes a light source 12 which directs light 14 onto illumination optics 16. The illumination optics 16 perform various functions depending upon the application. For example, if the source 12 is a laser source, the illumination optics 16 can include an anamorphic relay, a beam enlarger, a beam homogenizer and/or a field lens for generating a uniform light beam. If the light source 12 is an incandescent source, the illumination optics 16 can comprise a condenser illumination system for producing a uniform output. The illumination optics 16 direct illumination light 18 onto a patterned mask 20. The patterned light 22 which emerges from the mask 20 is directed onto projection optics 24. In one preferred embodiment, the projection optics 24 generate an enlarged image of the mask and direct output light 26 onto a surface 30 of a substrate 28 such that the enlarged image of the mask is formed on the substrate 28.

FIG. 2 is a schematic diagram of a laser source 112 and illumination optics 116 in accordance with one embodiment of the invention. The illumination optics 116 receive the light 114 from the laser 112 at an anamorphic relay 32 comprising two lenses 40 and 42 and two plates 44 and 46. The relay 32 shapes the laser beam appropriately from rectangular to square for the photolithographic process. Light from the relay 32 is directed onto a beam homogenizing system 34 which can comprise a four-sided plate prism 48 for splitting the light beam and a lens prism 50 having a four-faceted prism surface for redirecting the beams on top of one another and thus homogenizing the laser beam.

A mirror 36 directs the homogenized light through a field lens 38 which produces the output light 118 which provides the illumination for the mask 20. The homogenizer 34 shown in FIG. 2 is of the type described in commonly assigned and U.S. patent application Ser. No. 08/271,029 filed on Jul. 6, 1994, now U.S. Pat. No. 5,548,444, which is incorporated herein in its entirety by reference. Other types of homogenizers may be used. In addition, depending upon the laser used, the homogenizer may be eliminated altogether.

FIG. 3 is a schematic diagram of an alternative embodiment of the source and illumination optics. In this embodiment, the source is an incandescent light 212. Light 214 from the source 212 enters the illumination optics 216 which include three lenses 213, 215, 217 shaped and arranged to produce a condenser illumination system 216. The condenser illumination optics 216 generate uniformly bright light 218 used to illuminate the mask 20 and expose the desired pattern on the substrate.

The configuration of the projection optics 24 is in general driven by the requirements of the system. The configuration is designed based upon factors such as required system resolution, exposure pattern size, system telecentricity, the wavelength of the exposure light and the numerical aperture and f/number of the system. For example, the resolution R of the system, defined as the smallest feature size which can be resolved by the system is inversely proportional to the numerical aperture (NA) of the system and directly proportional to the wavelength $\lambda$ of the light at which the system is operating. Thus, at a given selected wavelength determined by the photoresist being used, improved resolution requires a high numerical aperture. Numerical aperture is inversely proportional to the f/number of the system. Therefore, good resolution requires low f/number, which can be difficult to achieve. Thus, the projection optics must be capable of providing a high numerical aperture to achieve high resolution, or, equivalently, small feature size, while also maintaining high telecentricity, a wide field, low distortion and low astigmatism.

Other photolithography systems with mask enlargement have been suggested in the prior art. For example, Japanese unexamined patent publication number 62-122126 suggests a system in which a pair of plane mirrors or a pair of lenses or even a single lens can be used to produce an enlarged image of the mask on a substrate. Also, U.S. Pat. No. 5,008,702 to Tanaka et al. suggests a system in which a single lens or a pair of ellipsoid mirrors can be used to perform the enlargement. With such simplistic enlargement optics, neither of these systems is capable of achieving the requirements which the system of the present invention achieves. For example, such systems are incapable of achieving the low resolution, wide field width, high telecentricity, low distortion and low astigmatism achieved by the present invention. These simple two-element and single-element systems using planar and conic elements cannot meet the requirements for a photolithography system dictated by the semiconductor and display industries.

Figure 4:
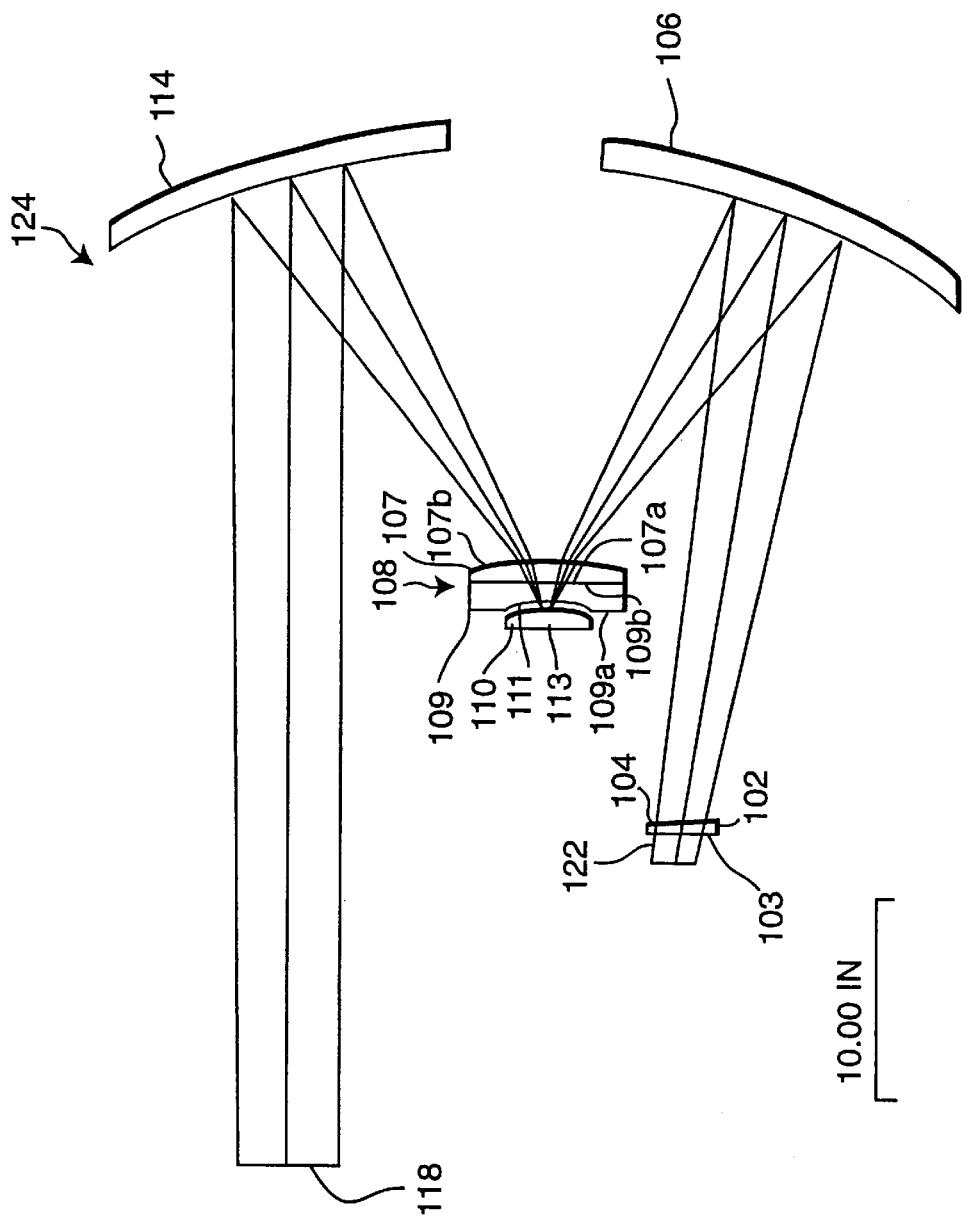
FIG. 4 is a schematic diagram of one preferred embodiment of the projection optics of the present invention.

FIG. 4 is a schematic block diagram of one preferred embodiment of projection optics 124 used in the photolithography system of the invention. In one preferred embodiment, these optics 124 are used to produce two-times (2×) enlargement. That is, the projection optics 124 produce an image on a substrate which is double the size of the mask pattern. In the projection optics 124 of FIG. 4, light 122 from the mask first passes through a refractive distortion corrector 102 which corrects for various types of distortion including pin cushion distortion, barrel distortion and other forms of distortion. A first surface 103 of the distortion corrector 102 is planar, and the second surface 104 is an aspheric shaped surface.

Light from the distortion corrector 102 is directed onto a surface of a positive aspheric powered primary mirror 106. Light from the primary mirror 106 is directed to an air-spaced lens doublet 108 comprising a first lens 107 and a second lens 109. The doublet 108 serves as an astigmatism corrector to improve the resolution of the system 124. The doublet 108 includes four optical surfaces, namely, the first surface 107b and second surface 107a of lens 107 and the first surface 109b and second surface 109a of lens 109. Surface 107a and surface 109b are both spherical surfaces. Surface 107b and surface 109a are both aspheric surfaces.

Light which passes through the lens doublet 108 strikes the negative aspheric powered secondary mirror 110 which serves as the aperture stop of the system 124. It comprises a reflective coating 111 deposited on the surface of a shaped substrate 113. Light from the secondary mirror 110 is reflected through the lens doublet 108 to a positive aspheric powered tertiary mirror 114 which forms the enlarged image 118 of the mask at the surface of the substrate being exposed.

Each optical surface of the optics of FIG. 4 can be described by Equation (1) below. Equation (1) describes surfaces which are bilaterally symmetric in both X and Y but not necessarily rotationally symmetric. Equation (1) and the variables and physical quantities listed therein are taken from the Code V User's Manual and other associated literature published by and available from Optical Research Associates. Code V is an optical design software package available from Optical Research Associates. The User's Manual and all of the literature associated with Code V are incorporated herein in their entirety by reference.

$$Z = \frac{CUX\,X^2 + CUY\,Y^2}{1 + SQRT[1 - (1 + KX)CUX^2X^2 - (1 + KY)CUY^2Y^2]} + \quad (1)$$
$$AR[(1 - AP)X^2 + (1 + AP)Y^2]^2 + BR[(1 - BP)X^2 + (1 + BP)Y^2]^3 +$$
$$CR[(1 - CP)X^2 + (1 + CP)Y^2]^4 + DR[(1 - DP)X^2 + (1 + DP)Y^2]^5;$$

where

Z—is the sag of the surface parallel to the Z axis,

CUX, CUY—are the curvatures in X and Y, respectively,

KX, KY—are the conic coefficients in X and Y, respectively, and correspond to eccentricity in the same way as K for the ASP surface type, AR, BR CR, DR—are the rotationally symmetric portion of the 4th, 6th, 8th, and 10th order deformation from the conic, and AP, BP, CP, DP—represent the non-rotationally symmetric components of the 4th, 6th, 8th, and 10th order deformation from the conic Table 1 is a file listing generated by Code V for the optical surfaces of FIG. 4. It gives complete characteristics for all of the surfaces of all of the elements shown including substitute values for the variables in Equation (1). Table 2 is a glossary of abbreviations which defines the abbreviations used in Table 1. The abbreviations and associated physical characteristics are also defined in the Code V User's Manual and associated literature.

TABLE 1

```
RDM;LEN
TITLE 'REFLECTIVE PROJ. OPTICS 2x (ASML3)'
     NAO    0.097
     DIM    I
     WL     365.0
     REF    1
     WTW    1
     1NI    'GMP'
     CA     APE
     XOB    0.0 0.0 0.0 2.28 2.28 2.28 4.56 4.56 4.56
     YOB    -3.515 0.0 3.515 -3.515 0.0 3.515 -3.515 0.0 3.515
     VUX    0.0 0.0 0.0 0.0 0.0 0.0 0.0 0.0 0.0
     VLX    0.0 0.0 0.0 0.0 0.0 0.0 0.0 0.0 0.0
     VUY    0.0 0.0 0.0 0.0 0.0 0.0 0.0 0.0 0.0
     VLY    0.0 0.0 0.0 0.0 0.0 0.0 0.0 0.0 0.0
     SO     0.0 76.1349290064
         THC  0
S              -70.0176157718 -31.2106402396 REFL
         CCY  0; THC 0
         ASP
         K    0.217500346293; KC 0
         IC   Yes; CUF 0.0
         A    0.964197052357e-7; B 0.734249377713e-11; C 0.601797907743e-14; D&
              0.355670476138e-17
         AC   0; BC 0; CC 0; DC 0
         E    -0.565744496308e-20; F 0.278497772167e-23; G 0.0; H 0.0
         EC   0; FC 0
         J    0.0
         XDE  0.0; YDE -19.3632308819; ZDE 0.0; XDC 100; YDC 0; ZDC 100
         REX  11.9; REY 11.6000003815
         ADY  19.435
         CUM  0.0; THM 2.0
S              -31.229684918 -1.45954577544 SILICA_SPECIAL
         CCY  1; THC 30
         ASP
```

TABLE 1-continued

```
    K    -8.54623113744; KC 13
    IC   Yes; CUF 0.0
    A    -0.310341422461e-4; B 0.311448336916e-6; C 0.211654115522e-8; D&
         -0.798316365955e-10
    AC   2; BC 3; CC4; DC 5
    E    0.997730866037e-12; F 0.0; G 0.0; H 0.0
    EC   6
    J    0.0
    CIR  6.15
S        551.633541885 -0.005
    CCY  40; THC 31
    CIR  6.15
S        -321.826568486 -1.66914076071 SILICA_SPECIAL
    CCY  41; THC 32
    CIR  6.15
S        -18.3450931938 -0.345104743867
    CCY  7; THC 0
    ASP
    K    -2.17332648616; KC 14
    IC   Yes; CUF 0.0
    A    -0.476574734841e-4; B 0.400219027094e-06; C 0.156651391336e-7; D&
         -0.193358160134e-8
    AC   8; BC 9; CC 10; DC 11
    E    0.805876201035e-10; F 0.0; G 0.0; H 0.0
    EG   12
    J    0.0
    CIR  3.75
S        -24.9701983582 0.345104743867 REFL
    CCY  0
    STO
    ASP
    K    0.265464981166; KC 0
    IC   Yes; CUF 0.0
    A    -0.343439578675e-5; B -0.529156594997e-7; C 0.761973759698e-8; D&
         -0.312374878835e-9
    AC   0; BC 0; CC 0; DC 0
    CIR  3.4
    CUM  0.0; THM 1.0
S        -18.3450931938 1.66914076071 SILICA_SPECIAL
    CCY  THC -32
    ASP
    K    -2.17332648616; KC 14
    IC   Yes; CUF 0.0
    A    -0.476574734841e-4; 0.400219027094e-6; C 0.156651391336e-7; D&
         -0.193358160134e-8
    AC   8; BC 9; CC 10; DC 11
    E    0.805876201035e-10; F 0.0; G 0.0; H 0.0
    EC   12
    J    0.0
    CIR  3.75
S        -321.826568486 0.005
    CCY  41; THC -31
    CIR  6.15
S        551.633541885 1.45954577544 SILICA_SPECIAL
    CCY  40; THC -30
    CIR  6.15
S        -31.229684918 29.4463993312
    CCY  1; THC 0
    ASP
    K    -8.54623113744; KC 13
    IC   Yes; CUF 0.0
    A    -0.310341422461e-4; B 0.311448336916e-6; C 0.211654115522e-8; D&
         -0.798316365955e-10
    AC   2; BC 3; CC 4; DC 5
    E    0.997730866037e-12; F 0.0; G 0.0; H 0.0
    EC   6
    J    0.0
    CIR  6.15
S        -50.5448093835 -29.4463993312 REFL
    CCY  0
    ASP
    K    0.210599847159; KC 0
    IC   Yes; CUF 0.0
    A    0.912852257642e-7; B 0.306648812717e-10; C -0.311193415968e-14; D&
         0.343356863197e-16
    AC   0; BC 0; CC 0; DC 0
    E    -0.317533586871e-19; F 0.165343877316e-22; G 0,0; H 0.0
    EC   0; FC 0
    J    0.0
```

TABLE 1-continued

```
      REX  13.95; REY 13.3000001907
      ADY  -17.435
      CUM  0.0; THM 2.0
S          0.0 -19.5691536203
      THC  0
S          -1629.76704542 -0.5 SILICA_SPECIAL
      CCY  0
      ASP
      K    0.0
      IC   Yes; CUF 0.0
      A    0.211925831612e-4; B -0.298749258785e-7; C 0.0; D 0.0
      AC   0; BC 0
      REX  3.15; REY 2.65000009537
      ADY  -10.14
S          0.0 -2.2771100671
      THC  0
      REX  3.15; REY 2.65000009537
      ADY  -10.14
SI         0.0 0.0
      DAR
      XDE  0.0; YDE -9.68161259758; ZDE 0.0; XDC 100; YDC 0; ZDC 100
THI        S6 OAL S5 . . . 7 0.0
THI        S11 OAL S10 . . . 12 0.0
GO
```

TABLE 2

| | |
|---|---|
| RDM: | radius input/output mode instead of curvature |
| LEN: | initialize data for new lens |
| TITLE: | title of output |
| NAO: | numerical aperture in object space |
| DIM: | lens units (inches/centimeters/millimeters) |
| WL: | wavelengths |
| REF: | number of reference wavelength |
| WTW: | wavelength weights |
| INI: | user initials for documentation |
| CA: | flag for use of apertures (YES/NO/APE) |
| XOB: | X object height in lens units |
| YOB: | Y object height in lens units |
| VUX: | fraction of entrance pupil radius clipped off for +X direction |
| VLX: | fraction of entrance pupil radius clipped off for -X direction |
| VUY: | fraction of entrance pupil radius clipped off for +Y direction |
| VLY: | fraction of entrance pupil radius clipped off for -Y direction |
| STO: | designate stop surface |
| Shorthand Surface Entry: | |
| General form: | |
| | S\|Sk\|Si . . . j y_rad_curv thickness |
| | glass_name\|REFL\|TIRO [glass_name] |
| | (y_rad_curv is either radius or curvature depending on RDM designation) |
| ASP: | change surface type to asphere (see polynomial description) |
| K: | conic coefficient |
| IC: | seley ray intersection, with normal and ray in same direction |
| CUF: | Fresnel surface with designated base curve |
| A: | 4th order aspheric coefficient |
| B | 6th order aspheric coefficient |
| C: | 8th order aspheric coefficient |
| D: | 10th order aspheric coefficient |
| E: | 12th order aspheric coefficient |
| F: | 14th order aspheric coefficient |
| G: | 16th order aspheric coefficient |
| H: | 18th order aspheric coefficient |
| J: | 20th order aspheric coefficient |
| XDE: | X displacement of new axis |
| YDE: | Y displacement of new axis |
| ZDE: | Z displacement of new axis |
| REX: | rectangular aperture X half-width dimension |
| REY: | rectangular aperture Y half-width dimension |
| ADY: | Y decenter for designated aperture |
| CIR: | circular aperture radius |
| CUM: | spherical curvature for back of 1st surface mirror |
| THM: | center thickness to back of 1st surface mirror |
| CCY: | curvature (radius) variable control code |
| THC: | thickness variable control code |
| KC: | conic constant variable control code |
| AC: | 4th order aspheric coefficient variable control code |
| BC: | 6th order aspheric coefficient variable control code |
| CC: | 8th order aspheric coefficient variable control code |
| DC: | 10th order aspheric coefficient variable control code |
| EC: | 12th order aspheric coefficient variable control code |
| FC: | 14th order aspheric coefficient variable control code |
| XDC: | X displacement variable control code |
| YDC: | Y displacement variable control code |
| ZDC: | Z displacement variable control code |
| DAR: | designate surface as a decenter-and-return surface |
| Thickness Solve: | THI Sk OAL Si . . . j length |
| | Solve center thickness on Sk to produce overall length (OAL) between surfaces |
| | Si and Sj equal to the value of length. |

Figure 5:
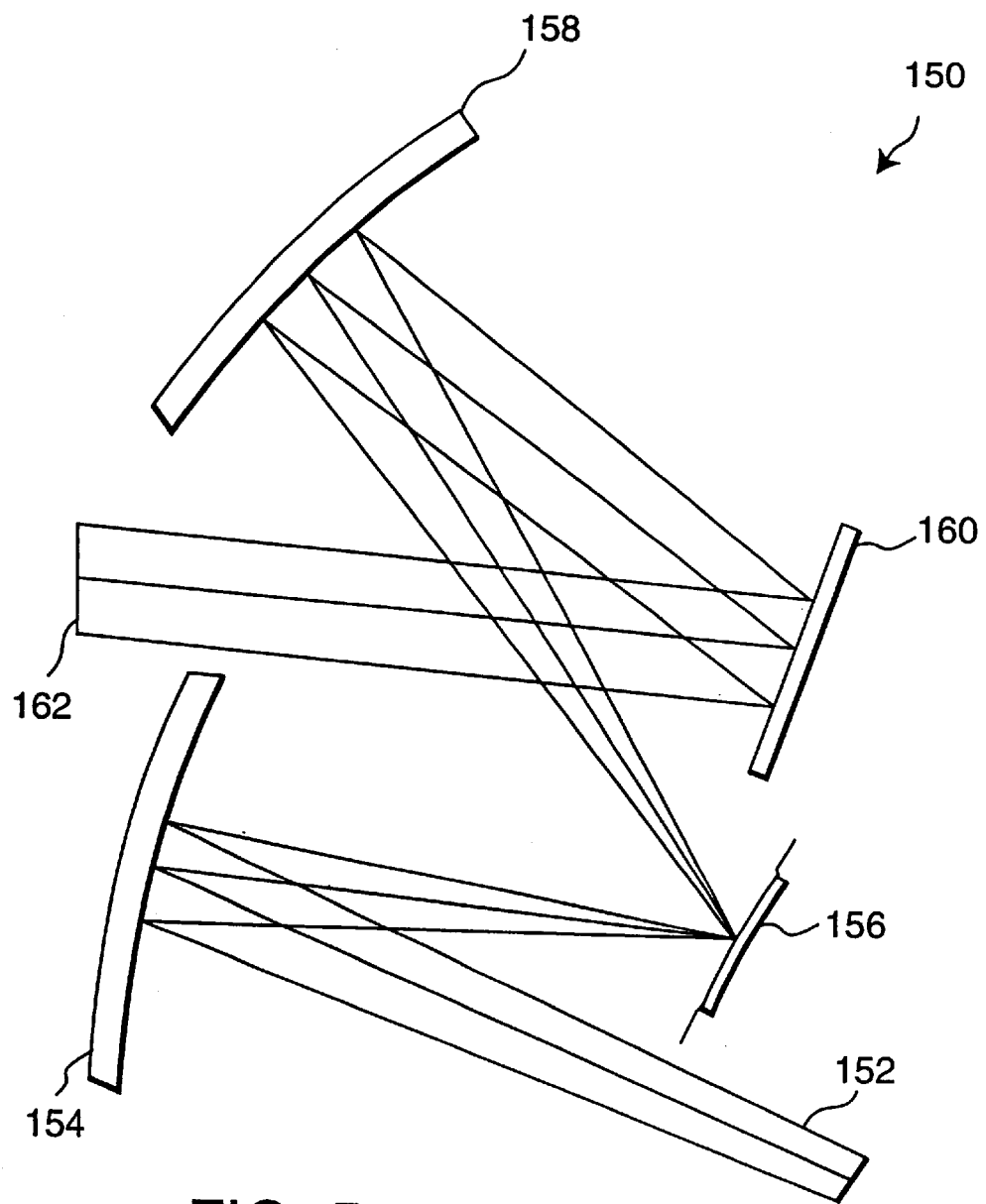
FIG. 5 is one alternative preferred embodiment of the projection optics of the present invention.

FIG. 5 is a schematic diagram of an alternative embodiment of the projection optics 150 of the present invention. Like the previously described embodiment, this embodiment also provides a 2× enlargement between the mask and the pattern image formed on the substrate. The embodiment shown in FIG. 5 includes four mirrors, each of which has an unusual, i.e., non-conic and non-aspheric, optical surface described by a polynomial. Unusual surfaces have deformations from conic shape which cannot be described by Equation (1). Light 152 from the mask is reflected from primary mirror 154 to secondary mirror 156 which also acts as the aperture stop for the system 150. The secondary mirror 156 reflects the light toward tertiary mirror 158 which in turn directs the light onto quaternary mirror 160. The quaternary mirror 160 forms the 2× enlarged image 162 of the mask at the surface of the substrate. As mentioned above, each of the mirrors 154, 156, 158 and 160 has an unusual shape defined by a polynomial. Mirrors 154 and 158 are positive powered unusual mirrors, and mirrors 156 and 160 are negative powered unusual mirrors.

Equation (2) is the polynomial which defines unusual surfaces such as the mirror surfaces of FIG. 5.

$$Z = \left(\frac{\alpha - \beta}{(1 - C_z\alpha)^{1/2} + (1 - C_z\beta)^{1/2}}\right) + (U_4\gamma^2(\alpha^2 - \beta^2) + \quad (2)$$
$$U_6\gamma^3(\alpha^3 - \beta^3) + U_8\gamma^4(\alpha^4 - \beta^4) + U_{10}\gamma^5(\alpha^5 - \beta^5)) +$$
$$A_1y^3 + A_2x^2y + A_3y^4 + A_4x^2y^2 + A_5x^4 + A_6y^5 + A_7x^2y^3 +$$
$$A_8x^4y + A_9y^6 + A_{10}x^2y^4 + A_{11}x^4y^2 + A_{12}x^6 + A_{13}y^7 + A_{14}x^2y^5 +$$
$$A_{15}x^4y^3 + A_{16}x^6y + A_{17}y^8 + A_{18}x^2y^6 + A_{19}x^4y^4 + A_{20}x^6y^2 +$$
$$A_{21}x^8 + A_{22}y^9 + A_{23}x^2y^7 + A_{24}x^4y^5 + A_{25}x^6y^3 + A_{26}x^8y +$$
$$A_{27}y^{10} + A_{28}x^2y^8 + A_{29}x^4y^6 + A_{30}x^6y^4 + A_{31}x^8y^2 + A_{32}x^{10};$$

where $\alpha = C_x(x - x_o)^2 + C_y(y - y_o)^2$, $\beta = C_xx_o^2 + C_yy_o^2$, $\gamma = 1 / \sqrt{C_x^2 + C_y^2}$.

Further details regarding Equation (2) are contained in "Nonrotationally Symmetric Systems: A New Problem for Optical Design and Fabrication, Applications of Geometrical Optics," by B. Tatian, *Proc. SPIE*, 39:205, (1973) and "Testing an Unusual Optical Surface," by B. Tatian, 1985 International Lens Design Conference, *Proc. SPIE*, 554:139, (1985), both of which are incorporated herein in their entirety by reference.

Table 3 is a computer printout which lists substitute values for the variables and coefficients of Equation (2) used to describe the four optical surfaces of FIG. 5. Table 4 is a glossary of abbreviations used in Table 3.

TABLE 4

| | |
|---|---|
| CLIC: | initialize data for new lens |
| MM: | lens units (millimeters) |
| ID: | title of lens |
| STOP: | designate stop surface |
| TYPE: | object data type |
| OBJ1: | object height in lens units (TYPE 3) |
| OBJ2: | distance from object to first surface (TYPE 3) |
| OBJ3: | marginal ray angle (TYPE 3) |
| H: | maximum object height in Y direction normalized to OBJ1 |
| WV1: | first wavelength |
| SN: | surface number |
| CV: | surface curvature |
| TH: | thickness to next surface |
| CC: | conic coefficient |
| NM: | index of refraction |
| CONT: | input data continuation flag (read in data on subsequent lines) |
| XD: | X displacement of new axis |
| YD: | Y displacement of new axis |
| AT: | tilt in XZ plane |
| BT: | tilt in YZ plane |
| UT: | negate tilt before proceeding to next surface |
| MIRR: | adjust coordinate system tilt as if mirror reflected before proceeding to next surface |
| Unusual Surface Coefficients: (see attached polynomial description) | |
| CX: | surface base curvature in X direction |
| CY: | surface base curvature in Y direction |
| CZ: | sets conic coefficient for the quadric (CCX = -1 + CZ/CX; CCY = -1 + CZ/CY) |
| YO: | Y displacement of axis of base quadric from Z axis of local |

TABLE 3

```
POLY=ps4,doly=g1,PRMS=pM1,polya=ps2,t=1000;
'CLIC' MM=1 ;
LENS_ = 17 ID='ASML4M.MDL' ;
STOP= 3 TYPE= 3 OBJ1=-134.0000000 OBJ2= 1.4250725722E+03
OBJ3= 9.6500000000E-02 WV1= 0.36500000 H= 0.82090000 ;
SN= 0 ;
SN= 1    CV= 4.8155932693E-05   TH= -1.2005131554E+03    CC= -8.40817115
NM= -1.00000000 CONT=1 ;
   XD= 0    YD=-150.3768207    AT= 0    BT=-3.7794594797E-01  UT= 1   MIRR=1
      CX= 3.8655932693E-05       CY= 4.8155932693E-05     CZ=-3.5674739114E-04
      Y0=-9.4228205652E+01       U4=-2.4870413368E-11     U6=-6.6917431136E-16
      Y3= 3.0902512637E-08       X2Y= 9.4554851156E-09    Y4= 6.5125911860E-11
      X2Y2= 6.9464488554E-11     X4 = 1.4696424767E-11    Y5 = 1.8131422932E-13
      X2Y3= 2.8334921895E-13     X4Y= 1.1262859295E-13    Y6= 3.1157028657E-16
      X2Y4= 7.6829431449E-16     X4Y2= 6.2180518423E-16   X6= 1.6373889732E-16 ;
SN= 2    CV= 3.6480239913E-04   TH= 1.5614213802E+03    CC= -0.12611114    CONT=1 ;
   XD= 0    YD=-60.02104507    AT= 0    BT=-1.2555809543E-01  UT= 2 MIRR=1
      CX= 3.5596823135E-04       CY= 3.6480239913E-04     CZ= 3.1879675098E-04
      Y0= 8.3252661835E+01       U4= 4.4246210302E-11     U6= 5.6417338753E-18
      Y3= 1.7414703278E-08       X2Y= 1.0179036312E-08    Y4=-1.9257270787E-11
      X2Y2=-4.1796502011E-11     X4 =-2.0780037090E-11    Y5 = 2.9138091736E-15
      X2Y3= 3.5931846661E-15     X4Y= 9.7880912390E-16    Y6=-1.9872742628E-18
      X2Y4=-4.8104973423E-18     X4Y2=-4.9508308828E-18   X6=-1.7260348488E-18 ;
SN= 3    CV= 8.0712102034E-04   TH=-1.1724100918E+03    CC= 2.69611347
NM= -1.00000000 CONT=1 ;
   XD= 0    YD=-49.58418071    AT= 0    BT= 4.4143975291E-01  UT= 3 MIRR=1
      CX= 8.1246442550E-04       CY= 8.0712102034E-04     CZ= 2.9832108773E-03
      Y0= 5.3717294465E+00       U4= 9.9422365563E-09     U6= 5.7346931839E-13
      Y3= 1.4499799570E-07       X2Y= 1.0173418999E-07    Y4=-5.0846000493E-09
      X2Y2=-1.0194589517E-08     X4 =-5.1112781850E-09    Y5 = 6.5151851876E-12
      X2Y3= 1.3050129588E-11     X4Y= 6.5440700459E-12    Y6=-2.0087480119E-13
      X2Y4=-6.0654046045E-13     X4Y2=-6.1076435589E-13   X6=-2.0491918073E-13 ;
SN= 4    CV= 5.6283787866E-04   TH= 1.5203344356E+03    CC= 1.07468593    CONT=1 ;
   XD= 0    YD= 50.54751899    AT= 0    BT=-1.5817856763E-01 UT= 4   MIRR=1
      CX= 5.5342621388E-04       CY= 5.6283787866E-04     CZ= 1.1677118297E-03
      Y0=-1.7845331493E+01       U4=-4.5378276818E-10     U6=-5.9894313104E-16
      Y3= 8.5049747506E-09       X2Y= 6.9528803749E-09    Y4= 2.1234922862E-10
      X2Y2= 4.1578653373E-10     X4 = 2.0320895057E-10    Y5 = 1.9259750237E-14
      X2Y3= 3.7733104534E-14     X4Y= 1.8395226634E-14    Y6= 2.0500896897E-16
      X2Y4= 6.0497943131E-16     X4Y2= 5.9354293205E-16   X6= 1.9454018909E-16 ;
SN= 5 CONT=1 ;
   XD= 0    YD= 5.81973751    AT= 0    BT=-2.0673315191E-01 ;
```

TABLE 4-continued

| | coordinate system |
|---|---|
| U4: | 4th order aspheric coefficient |
| U6: | 6th order aspheric coefficient |
| Y3: | $Y^3$ aspheric coefficient |
| X2Y: | $X^2Y$ aspheric coefficient |
| Y4: | $Y^4$ aspheric coefficient |
| X2Y2: | $X^2Y^2$ aspheric coefficient |
| X4: | $X^4$ aspheric coefficient |
| Y5: | $Y^5$ aspheric coefficient |
| X2Y3: | $X^2Y^3$ aspheric coefficient |
| X4Y: | $X^4Y$ aspheric coefficient |
| Y6: | $Y^6$ aspheric coefficient |
| X2Y4: | $X^2Y^4$ aspheric coefficient |
| X4Y2: | $X^4Y^2$ aspheric coefficient |
| X6: | $X^6$ aspheric coefficient |

Both the projection optics 124 of FIG. 4 and the projection optics 150 of FIG. 5 achieve a nominal system resolution of 3 μm at an exposure light wavelength of 0.365 μm. Both systems are thus ideally suited for high density semiconductor and flat panel display applications. Hence, using a standard six inch square mask having a minimum line width of 1.5 μm, the 2× enlargement systems of FIGS. 4 and 5 can produce a semiconductor wafer or flat panel display having a twelve inch square pattern area with 3 μm line width which can include active matrix LCD pixels as well as driver circuits along the boarder of the panel.

Figure 6:
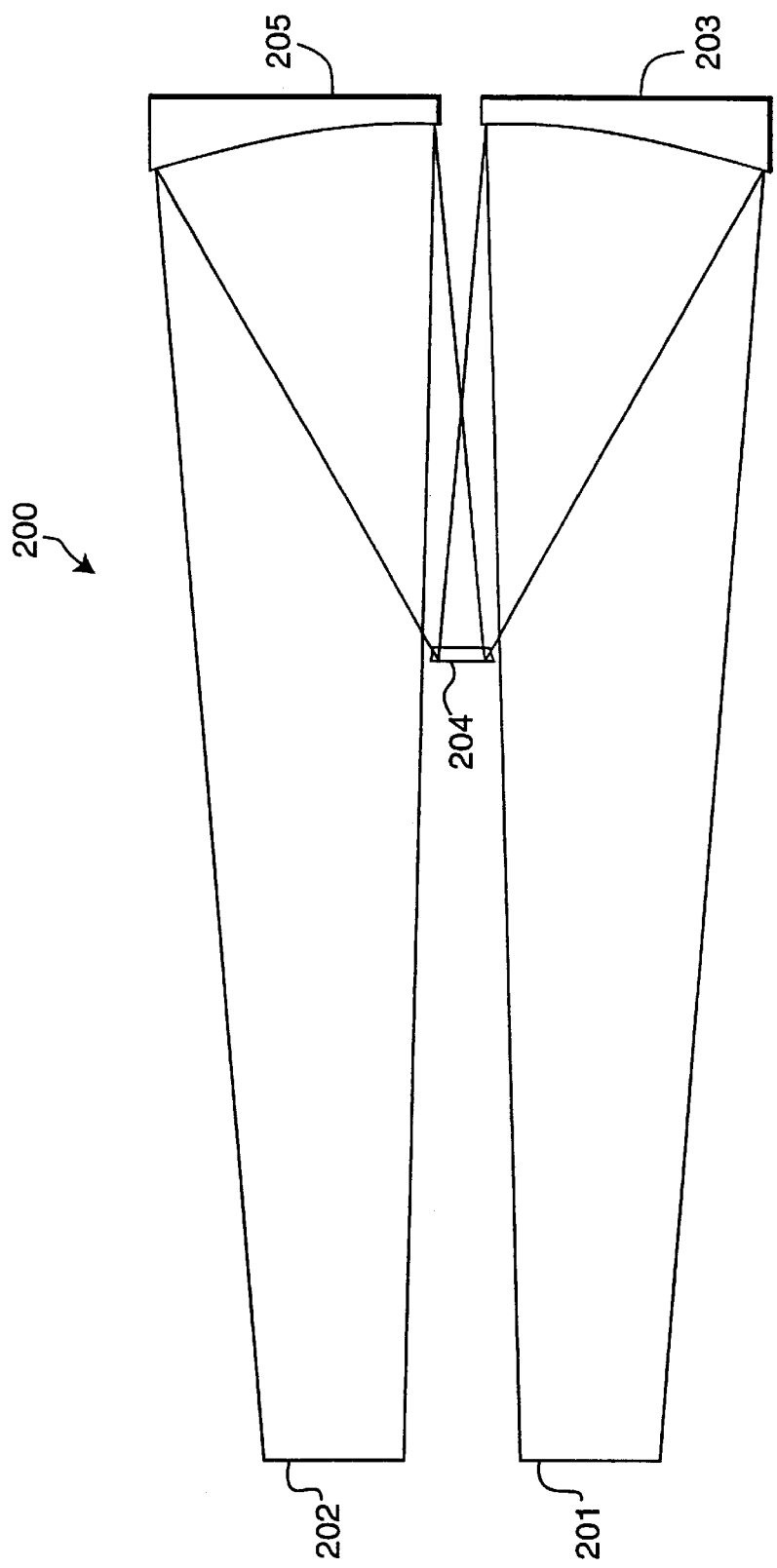
FIG. 6 is another alternative preferred embodiment of the projection optics of the present invention.

FIGS. 6–9 are schematic diagrams of four alternative embodiments of the projection optics of the invention. FIG. 6 is a schematic diagram of an embodiment 200 of a 1× projection optics system. That is, the image 202 of the mask formed at the surface of the substrate is the same size as the mask pattern 201 itself. The 1× system 200 includes a primary mirror 203 which reflects light from the mask back onto a Mangin secondary mirror 204. The Mangin mirror 204 includes a reflective coating on the back surface of a refractive optical material such as glass. The device simultaneously serves as a reflective aperture stop for the system and a refractive astigmatism corrector. Light from the Mangin mirror 204 is directed onto a tertiary mirror 205 which forms the image 202 of the mask on the surface of the substrate.

The system 200 of FIG. 6 has numerical aperture of 0.05 and achieves a field format of 50 cm×50 cm. The system is designed to produce an image at an exposure wavelength of 0.25 μm. The diffraction blur of the system is 2.9 μm (50% energy diameter). The wavefront error is less than 0.03 waves and the distortion over the 50 cm×50 cm format is 0.0 μm. The telecentricity of the system is less than 0.31 degrees.

Regarding the optical elements themselves, the primary mirror 203 and tertiary mirror 205 are identical. Both are 1 meter×1 meter sections with identical surface prescriptions and locations. Both have sixth-order rotationally symmetric aspheric surfaces with 37 μm aspheric departure and 0.22 μm/mm aspheric departure slope. Regarding surface quality, the distortion criterion is λ/70 peak-to-valley over the entire footprint, and wavefront criterion is λ/20 peak-to-valley over the footprint at a wavelength of 0.6328 μm. The secondary Mangin mirror 204 is made of fused silica material with a reflective coating on its backside. It has a 24 cm diameter and both of its surfaces have eighth-order rotationally symmetric aspheric shape with <1 μm aspheric departure and less than 0.11 μm/mm aspheric departure slope. The surface quality is λ/20 peak-to-valley over the footprint (wavefront criterion) at a wavelength of 0.6328 μm.

Figure 7:
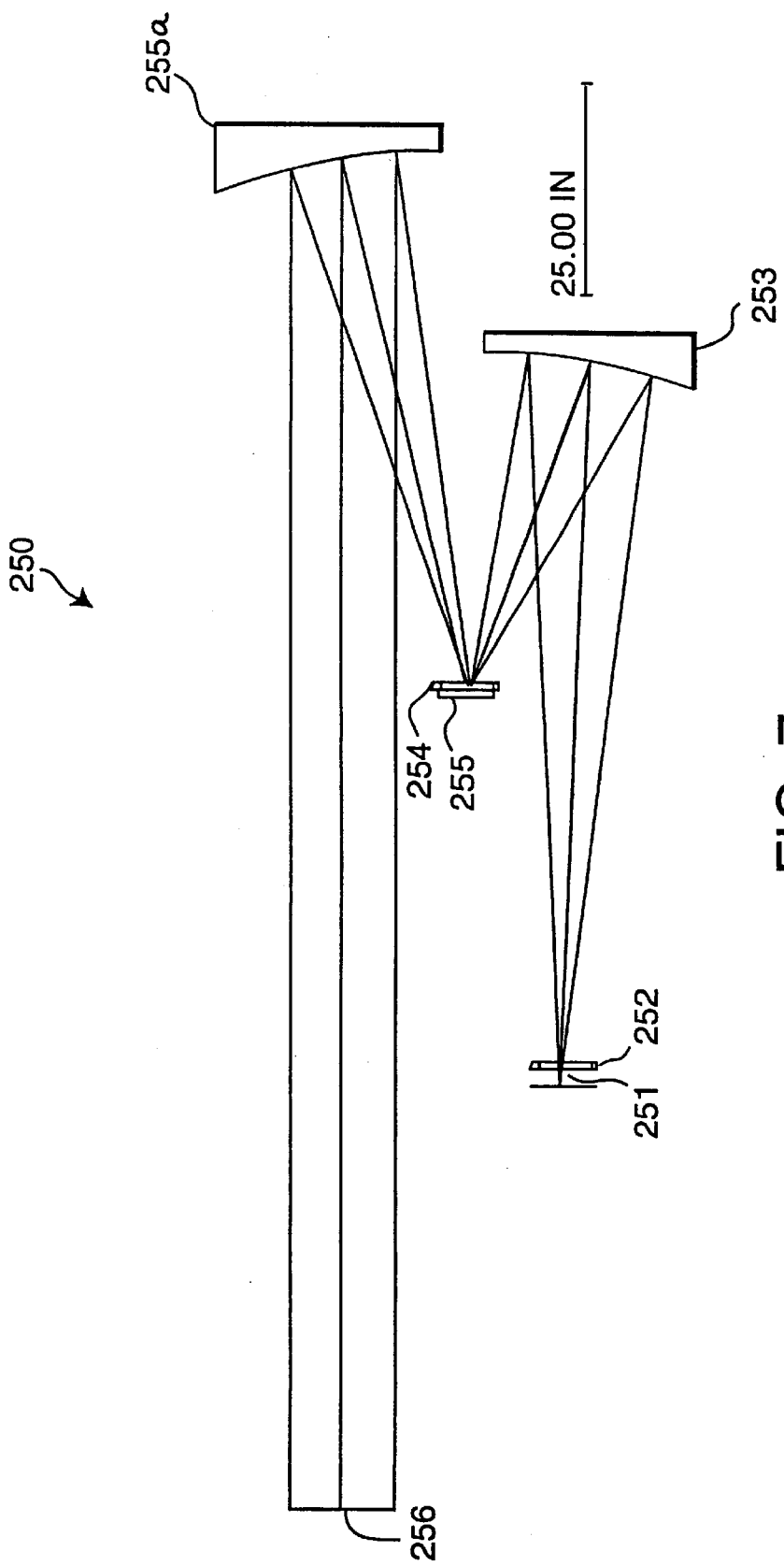
FIG. 7 is another alternative preferred embodiment of the projection optics of the present invention.

FIG. 7 is a schematic diagram of a 2.5× projection optics system 250 in accordance with the invention. The system 250 provides a 50 cm×50 cm display format from a 20 cm×20 cm mask format. The system 250 is f/12.5 at the substrate and f/5.0 at the mask and is designed to operate at an exposure wavelength of 0.248 μm. The distortion of the system is <0.08 μm over 0.5 m. The telecentricity of the system at the image plane is less than 0.32 degrees and at the mask plane is less than 4.80 degrees.

The system of FIG. 7 is similar to the 2× embodiment described above in connection with FIG. 4. Light 251 from the mask first passes through a plano-conic distortion corrector 252. The light then strikes a positive powered mirror of tenth-order rotational asphericity which reflects the light through an aspheric-planar astigmatism corrector 254 and onto the reflective surface of the secondary mirror and aperture stop 255 of the system. A first surface of the astigmatism corrector 254 has a sixth-order rotationally symmetric aspheric surface, and the back surface is planar. The secondary mirror 255 is a negative powered mirror having a conic shape. The light reflected by the secondary mirror 255 passes through the astigmatism corrector to tertiary mirror 255a which forms the image 256 of the mask on the surface of the substrate.

Figure 8:
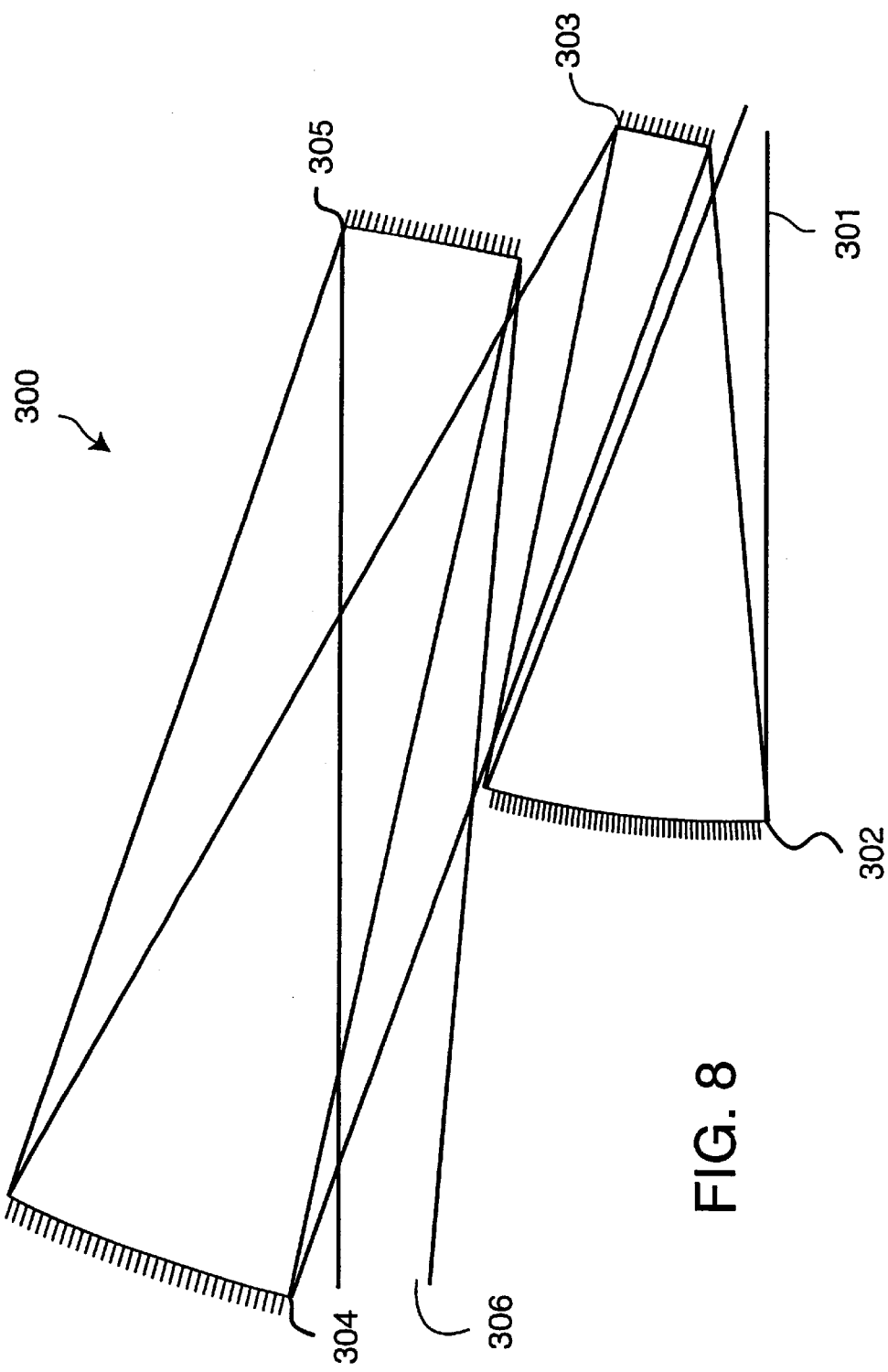
FIG. 8 is another alternative preferred embodiment of the projection optics of the present invention.

FIG. 8 is a schematic diagram of a 4× projection optics system 300 in accordance with the present invention. This embodiment is similar to the 2× embodiment described in connection with FIG. 5 in that it also includes four mirror surfaces which generate the enlarged image. The RMS wavefront error of the system is <0.083 waves and the distortion is 0.025 μm over the 50 cm×50 cm field format of the system. The numerical aperture of the system is 0.0417 and the designed exposure wavelength is 0.250 μm. In the system 300, light 301 from the mask is reflected from primary mirror 302 to secondary mirror 303 to tertiary mirror 304 to quaternary mirror 305 which forms the image 306 of the mask at the surface of the substrate. The primary mirror 302 and secondary mirror 304 are both positive powered mirrors, and the secondary mirror 303 and quaternary mirror 305 are negative powered mirrors. All four mirrors have rotationally symmetric aspheric surfaces. The primary mirror 302 is 80 cm×72 cm and has 1,172 μm aspheric departure and 3.6 μm/mm aspheric departure slope. The secondary mirror 303 is circular with a 26 cm diameter. It has 1,190 μm aspheric departure and 10.4 μm/mm aspheric departure slope. The tertiary mirror 304 is 78 cm×75 cm, has 987 μm aspheric departure and 2.7 μm/mm aspheric departure slope. The quaternary mirror 305 is 48 cm×48 cm, has 116 μm aspheric departure and 0.5 μm/mm aspheric departure slope.

Figure 9:
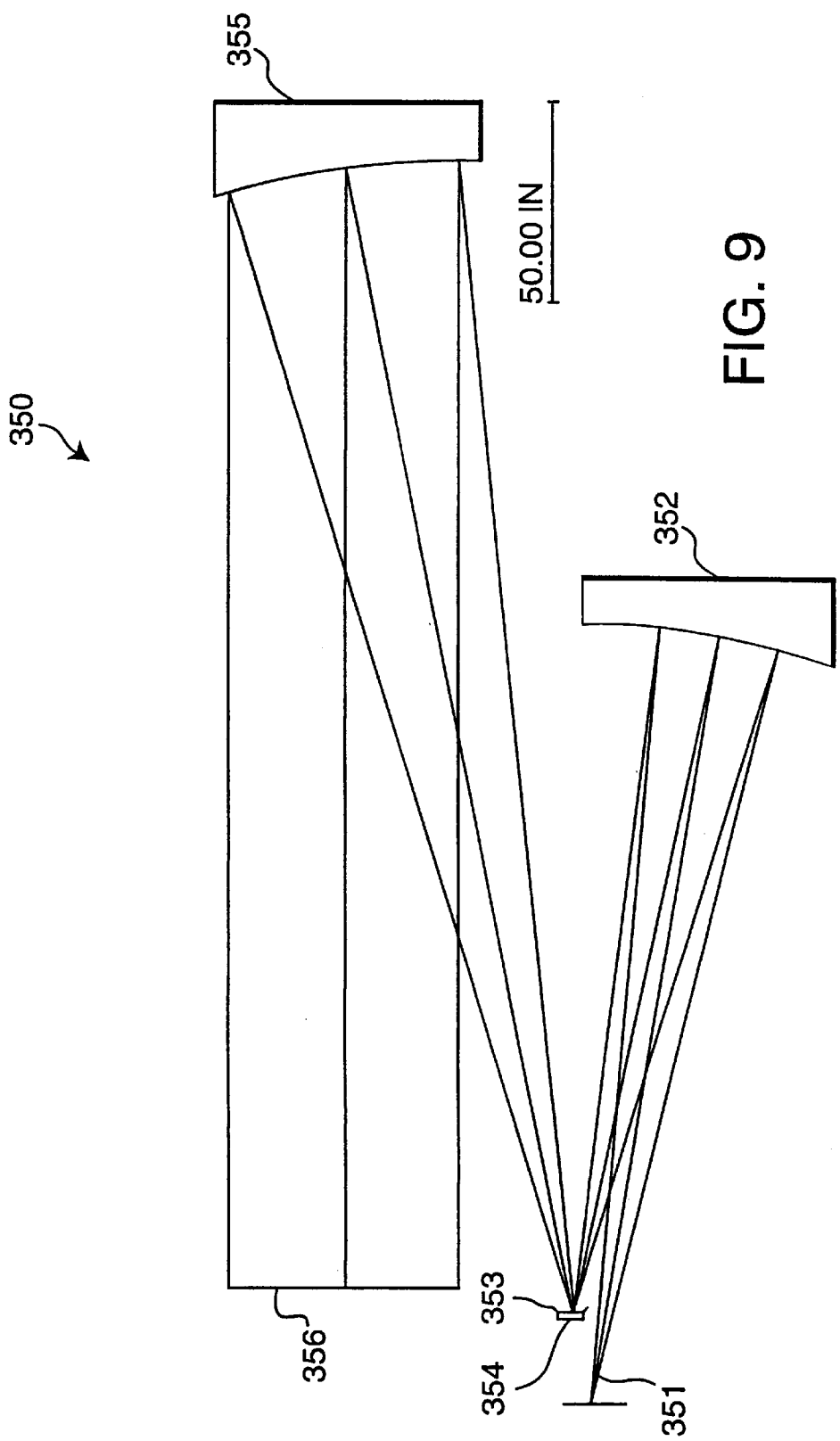
FIG. 9 is another alternative preferred embodiment of the projection optics of the present invention.

FIG. 9 is a schematic diagram of a 10× projection system 350 in accordance with the present invention. Light 351 from the mask is reflected by primary mirror 352 onto and through an astigmatism corrector 353 to the secondary mirror 354, which serves as the aperture stop of the system. Light is reflected by the secondary mirror 354 back through the astigmatism corrector 353 onto tertiary mirror 355 which reflects the light to form the image 356 of the mask on the surface of the substrate. The system is f/80 at the substrate surface and has a field format of 2.0 m×2.0 m. The distortion is less than 0.01 μm over 2.0 m, and the design wavelength is 0.248 μm. The telecentricity at the substrate plane is less than 0.29 degrees and at the mask plane is less than 13.5 degrees. The primary mirror 352 and tertiary mirror 355 both have tenth-order rotationally symmetric asphericity. The secondary mirror 354 has a conic surface, and the astigmatism corrector 353 has a conic front surface and planar back surface.

Figure 10:
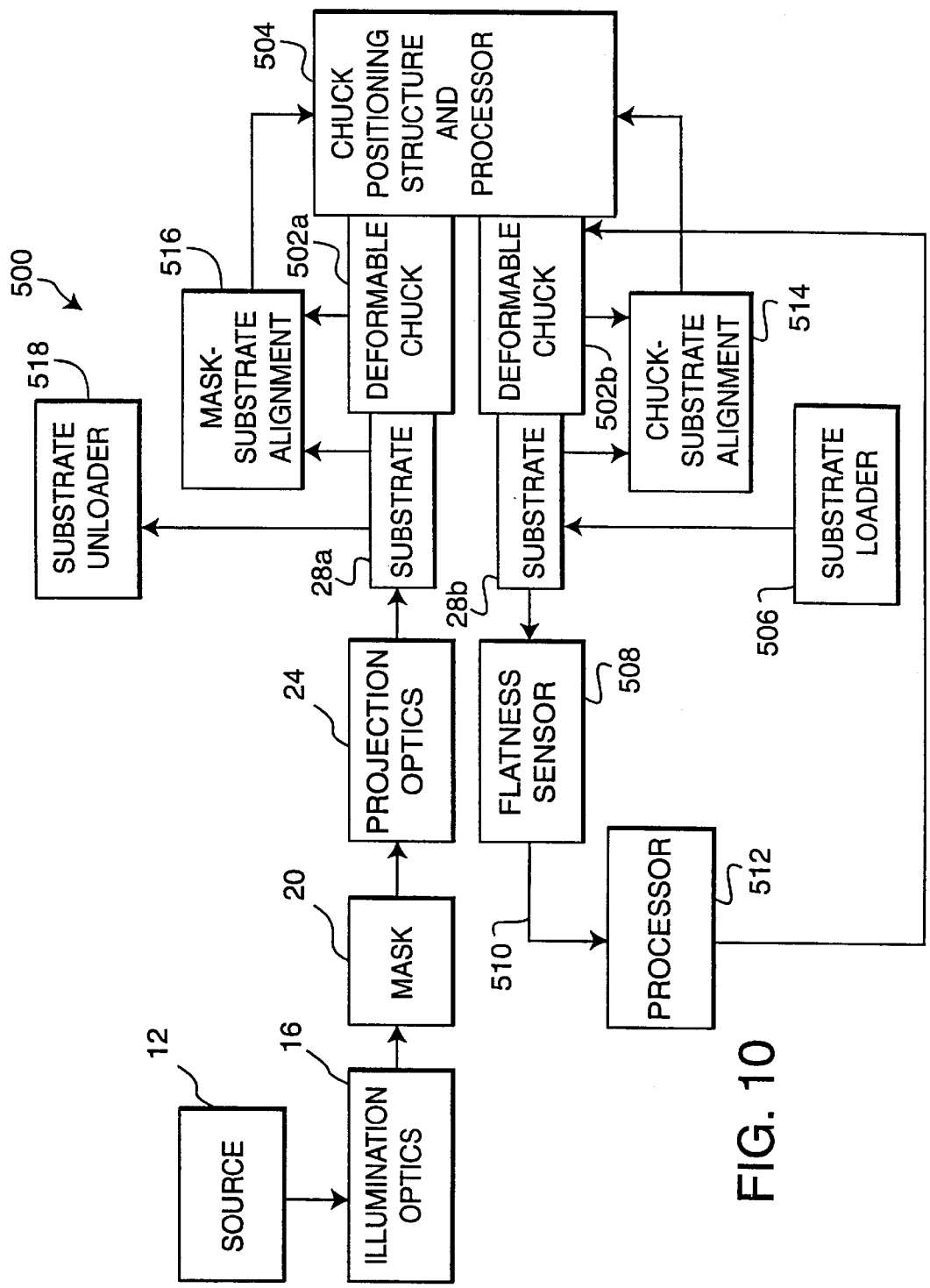
FIG. 10 is a schematic functional block diagram of a photolithography system in accordance with the present invention.

FIG. 10 is a schematic functional block diagram showing a preferred photolithography system 500 using an enlarged mask image in accordance with the present invention. The system 500 includes a source 12 of light and illumination optics 16 which receive light from the source and direct light onto the mask 20 to illuminate the mask. Light transmitted by the mask 20 is received by the projection optics 24 described in detail above.

The projection optics 24 project the enlarged image of the mask 20 onto a surface of a first substrate 28a mounted to a first deformable chuck 502a which is shown located in an exposure position by a chuck positioning structure and processor 504. The chuck positioning structure and processor 504 also locates a second deformable chuck 502b in a flattening position as shown. A second substrate 28b is mounted on the second deformable chuck 502b.

In operation, a substrate loader 506 loads a substrate 28b onto the deformable chuck 502b. A flatness sensor 508 of the system detects the flatness of the top surface of the substrate 28b. A signal indicative of the flatness of the substrate 28b is forwarded on line 510 to a processor 512. The processor generates control signals and forwards them to the deformable chuck 502b. The control signals are used to selectively deform the chuck to flatten the surface of the substrate 28b to ensure that the subsequent exposure will be in focus and free of pattern distortion.

After the substrate loader 506 loads a substrate 28b onto the deformable chuck 502b, a chuck-substrate alignment system 514 is used to provide an initial coarse alignment between the substrate 28b and the surface of the deformable chuck 502b. Where the substrate 28b is a transparent panel for a flat panel display system, the opposite corners of the substrate are formed with opaque mask regions surrounding a circular transparent region. The surface of the chuck 502b includes two CCD pixel arrays located on the chuck so as to be positioned beneath the opaque masked regions and inner transparent regions of the substrate 28b. As a substrate 28b is loaded onto the chuck 502b by the substrate loader 506, the substrate loader 506 is adjusted to ensure that each inner circular transparent region of the opaque masking region of the substrate 28b overlays a CCD pixel array.

In a preferred embodiment, while the substrate 28b in the flattening position is being flattened, substrate 28a in the exposure position can be exposed. However, before the exposure, the mask pattern is first aligned with the substrate 28a via the mask-substrate alignment system 516. This fine adjustment of the substrate location is performed by activating the source 12 to illuminate the top surface of the substrate 28a with the enlarged mask pattern with light having a wavelength to which the photoresist on the top surface of the substrate 28a is not reactive. This prevents the photoresist from being exposed during the alignment process. Each mask pattern is produced to generate a circular pattern of light at opposite corners such that when the mask pattern is precisely aligned with the substrate 28a, the CCD pixel arrays on the deformable chuck 502a beneath the circular transparent regions of the opaque mask regions of the substrate 28a will be illuminated.

The processor in the chuck positioning system 504 reads the CCD pixel arrays during the alignment process to determine if the circular illumination spots are centered on the circular transparent regions formed on the substrate 28a within the opaque masking regions. The position of the deformable chuck 502a is adjusted according to the pixel data to center the circular illumination spots within the circular transparent regions in order to precisely align the mask pattern with the substrate 28a before exposure. The mask-substrate alignment process is done to ensure proper registration between pattern layers in devices requiring multiple exposure and fabrication pattern layer steps. After alignment, exposure of the substrate 28a with the mask pattern is implemented. The source 12 is activated to provide output light at a wavelength to which the photoresist is reactive. After the exposure, in one embodiment, a substrate unloader 518 is activated to unload the exposed substrate.

In one preferred embodiment, the chuck positioning structure and processor 504 is operable to switch the deformable chucks 502a and 502b between the exposure position and the flattening position. The system 500 simultaneously flattens one panel while it is aligning and exposing another. In operation, a substrate is first loaded onto a deformable chuck 502 located in the flattening position. The flatness sensor 508 and chuck 502 are then activated to flatten the substrate 28. Next, the chuck positioning structure and processor 504 is activated to switch the positions of the chucks such that the substrate 28 which was just loaded is moved into the exposure position. The substrate 28 is then illuminated by the alignment pattern to align the mask pattern to the substrate. When the mask substrate alignment is complete, the substrate is exposed.

Next, in one embodiment, the substrate unloader 518 is activated to remove the substrate from the chuck while it is still located in the exposure position. In another embodiment, the chuck positioning structure and processor 504 is activated to move the substrate back to the flattening position where a substrate unloader unloads the substrate 28 and the substrate loader 506 loads the chuck with the next substrate to be exposed. Alternatively, the substrate loader and unloader can be combined into a single device which both loads and unloads substrates.

Figure 11:
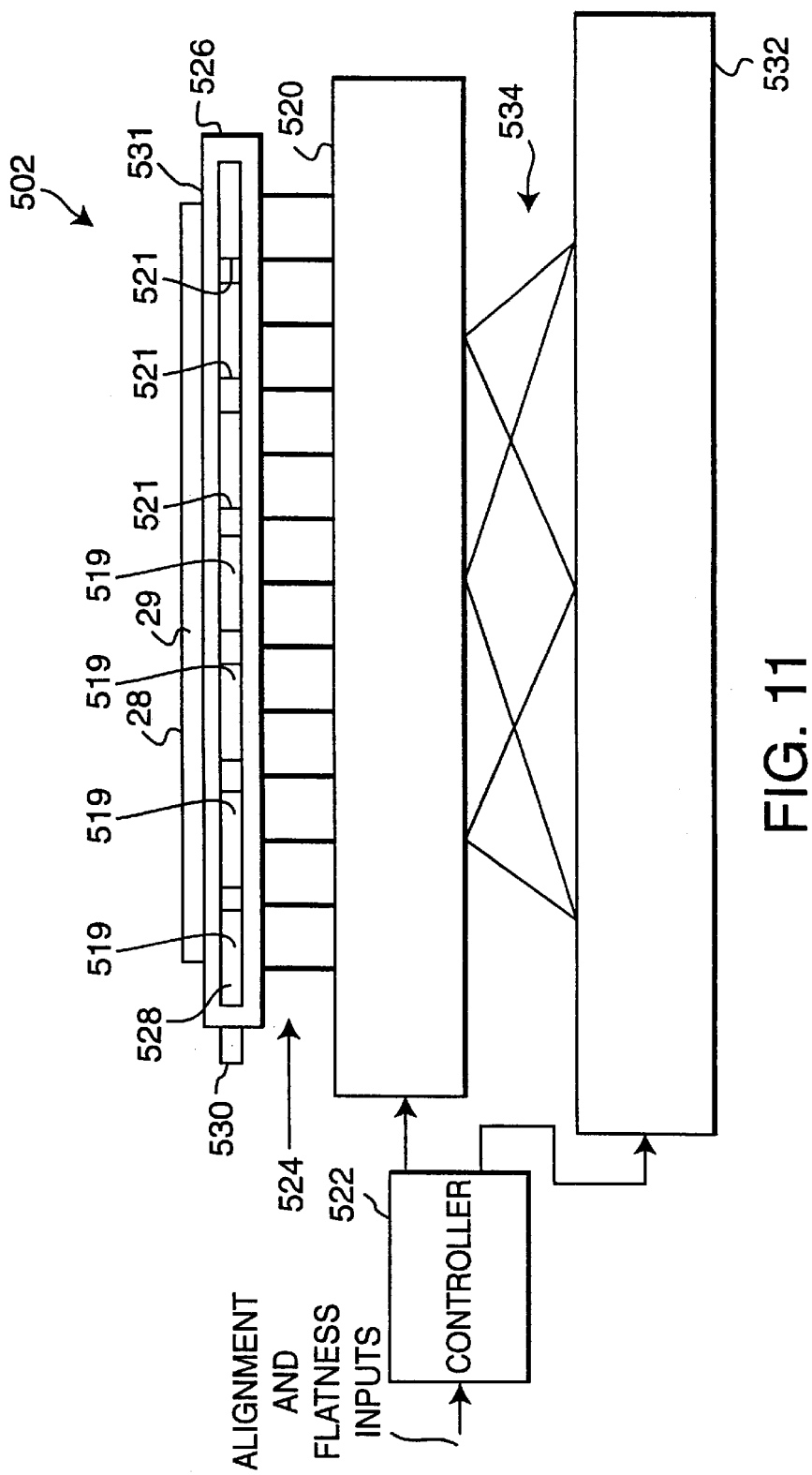
FIG. 11 is a schematic diagram of a preferred embodiment of the deformable chuck of the present invention.

FIG. 11 is a schematic diagram of one embodiment of a deformable chuck 502 used in the photolithography system of the invention. In this embodiment, the chuck 502 comprises a base 520 on which are mounted plural controllable actuators 524. Each actuator 524 has a variable length which is controllable by an applied control voltage. The actuators 524 can be piezoelectric transducers or a combination of a piezoelectric transducer and a stepper motor geared to a shaft, or simply a linear stepper motor. In either case, each actuator 524 is individually addressable by the controller 522 via the base 520 such that its length can be individually controlled. The controller 522 receives chuck alignment and flatness control inputs as shown in FIG. 10 and forwards appropriate actuator control outputs to the actuators 524 via the base 520. The controller 522 flattens the top surface 29 of the substrate 28 by commanding the actuators 524 to change their lengths. This causes the mounting surface 526 to deform and hence in turn, causes the substrate 28 to deform to flatten the surface 29.

The deformable chuck 502 includes a deformable mounting plate 526 on which the substrate 28 being patterned is mounted. The substrate 28 can be held to the mounting plate 526 via electrostatic attraction, in which case the substrate 28 and mounting plate 526 are charged at opposite polarities to attract them. Alternatively, the chamber 528 within the plate 526 can be evacuated by a vacuum system connected to a vacuum port 530. In the case of vacuum hold down, the top surface 531 of the mounting plate 526 can be a porous metal or ceramic or it can be a metal or cermamic with machined channels such that the negative pressure generated within the chamber 528 holds the substrate 28 to the top surface 531.

The chamber 528 in the mounting plate 526 preferably includes plural regions 519 defined by walls 521 within the chamber 528. The walls 521 can be arranged to position the regions 519 in a predetermined pattern to optimize the vacuum hold down function. For example, the walls 521 can be arranged to form multiple concentric annular regions 519. When the vacuum is activated, the region at the center of the chamber will pump down first since it has the smallest volume. The regions will successively pump down radially from the center. This ordering results in good contact between the substrate 28 and the top surface 531 of the mounting plate 526.

The chuck 502 is mounted to a support structure 532 by a six-leg adjustable "hexapod" 534. Each leg of the hexapod 534 is controllably deformable to change its length via control signals from the controller 522. The controller 522 generates the hexapod control signals based on the alignment and flatness inputs shown in FIG. 10. The six-leg hexapod 534 provides six degrees of freedom movement of the chuck 502 relative to the support structure 532. Up and down, side to side, tilt and rotational movements can be implemented to position the substrate 28 relative to the projection optics as desired.

Figure 12A:
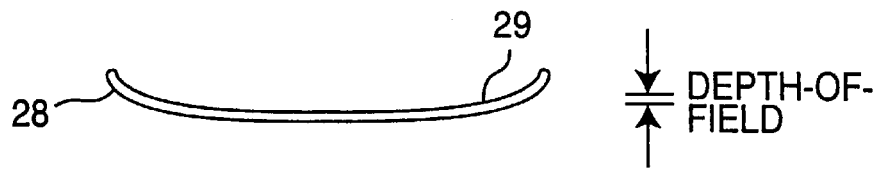
FIGS. 12A–12C are schematic illustrations of the substrate flattening process of the present invention.
Figure 12B:
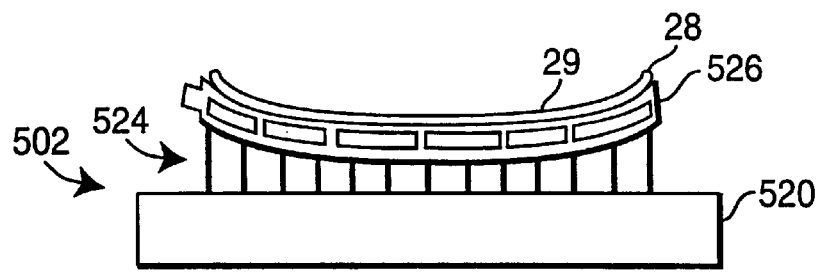
Figure 12C:
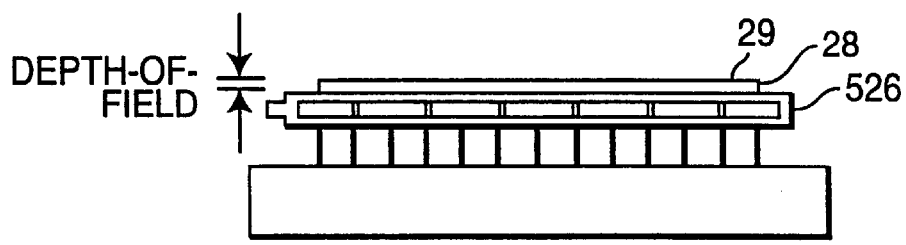

FIGS. 12A–12C schematically illustrate flattening of a substrate 28. In FIG. 12A, a substrate 28 is shown having an exaggerated bowed shape. FIG. 12A also shows the problems this can cause where the bow in the substrate is greater than the depth of field of the system, as illustrated. In this case, much of the pattern formed on the top surface 29 of the substrate 28 would be out of focus, resulting in failed or unreliable circuits or displays and undesirably large feature sizes.

FIG. 12B shows the intermediate step of mounting the bowed substrate 28 on the chuck 502 and deforming the mounting plate 526 to hold the substrate 28 down. Finally, in FIG. 12C, the substrate 28 is shown with its top surface flattened by the deformable mounting plate 526. As shown, the top surface 29 is flat across its entire surface within the depth of field of the system. Therefore, none of the pattern along the entire top surface 29 will be out of focus upon exposure.

Figure 13:
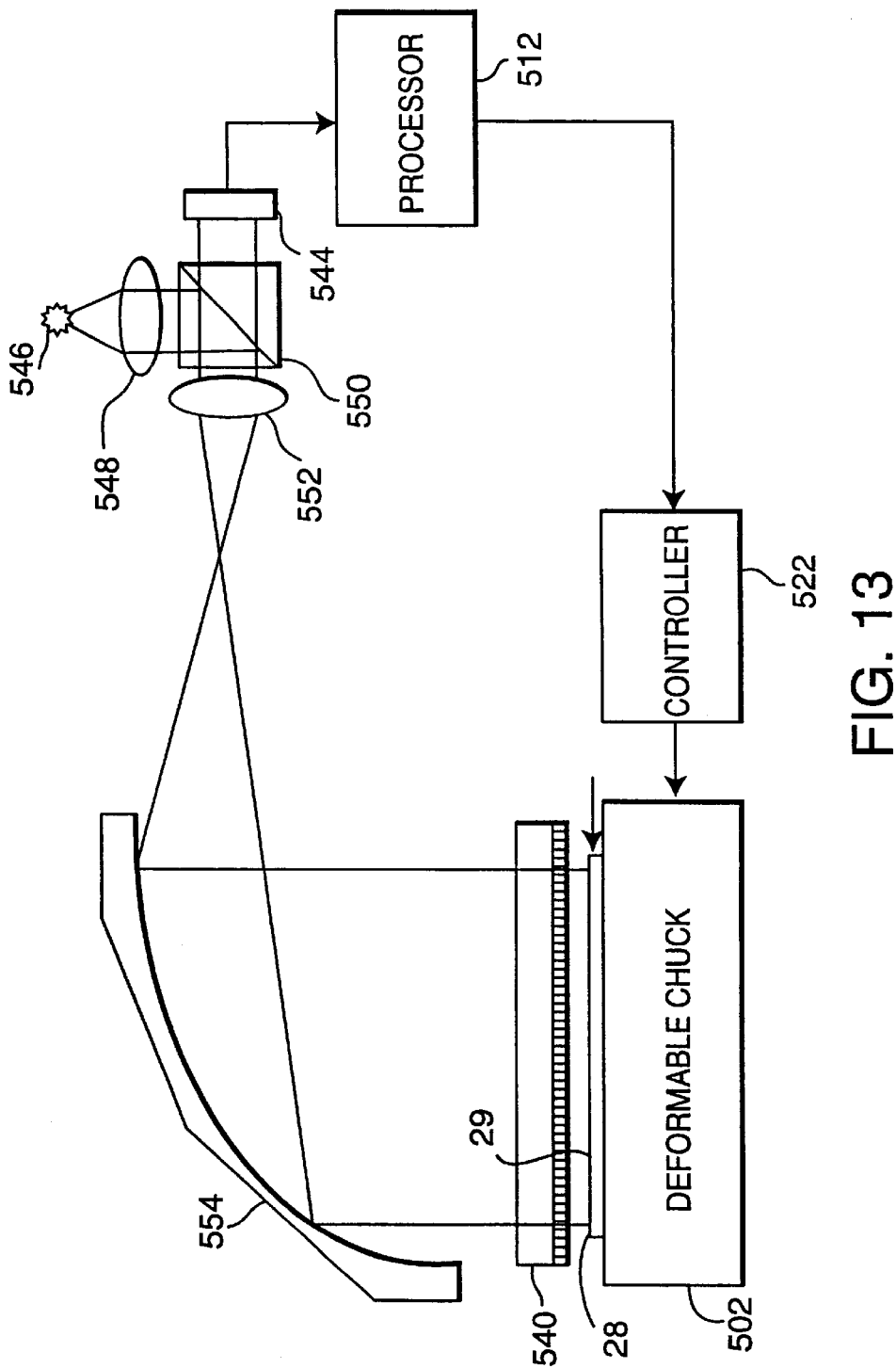
FIG. 13 is a schematic functional block diagram of the panel flattening and panel flatness sensing processes of the invention.

FIG. 13 is a schematic diagram of the substrate flatness sensing system of the invention. A light source 546 emits light which is collimated by a lens 548 and projected onto a partially transmissive mirror 550. Light from the mirror is directed onto a lens 552 which in turn directs the light onto a mirror 554. The light is then directed through a Ronchi grating 540 which projects a pattern onto the surface 29 of substrate 28 mounted on the deformable chuck 502. Light returning from the surface 29 of the substrate 28 passes through the Ronchi grating 540, generating a Moire pattern which is reflected by mirror 554 through the lens 552, and then through the partially transmissive mirror 550 onto the CCD detector 544. The processor 512 reads the pixel data from the CCD detector 544 to analyze the Moire pattern. Based on the Moire pattern, the processor 512 generates and forwards flatness inputs to the chuck controller 522. As described above, the controller 522 generates control signals used to deform the deformable actuators 524 of the chuck 502 to flatten the surface 29 of the substrate 28.

Figure 14A:
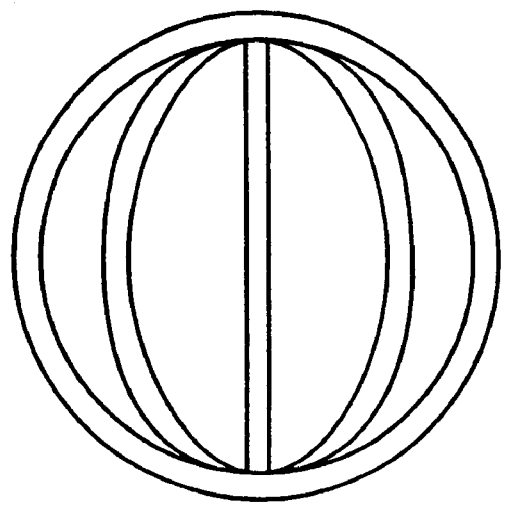
FIGS. 14A and 14B compare the Moire patterns for an irregular substrate surface and a flattened substrate surface.
Figure 14B:
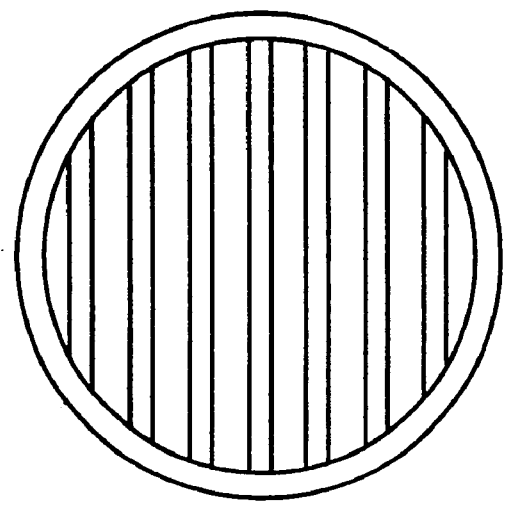

FIGS. 14A and 14B show two examples of portions of Moire patterns used in the flattening process. FIG. 14A shows a portion of a possible Moire pattern generated by a substrate surface which is not flat. FIG. 14B shows the same portion of the Moire pattern from the same surface after the flattening process has been completed. The processor 512 shown in FIG. 13 reads the CCD pixels from the detector 544 and identifies the Moire pattern. As the substrate is deformed, and the pattern changes, the processor 512 continues to monitor the pattern. When the pattern approaches that of FIG. 14B, the flattening process is concluded.

Figures 15A, 15B:
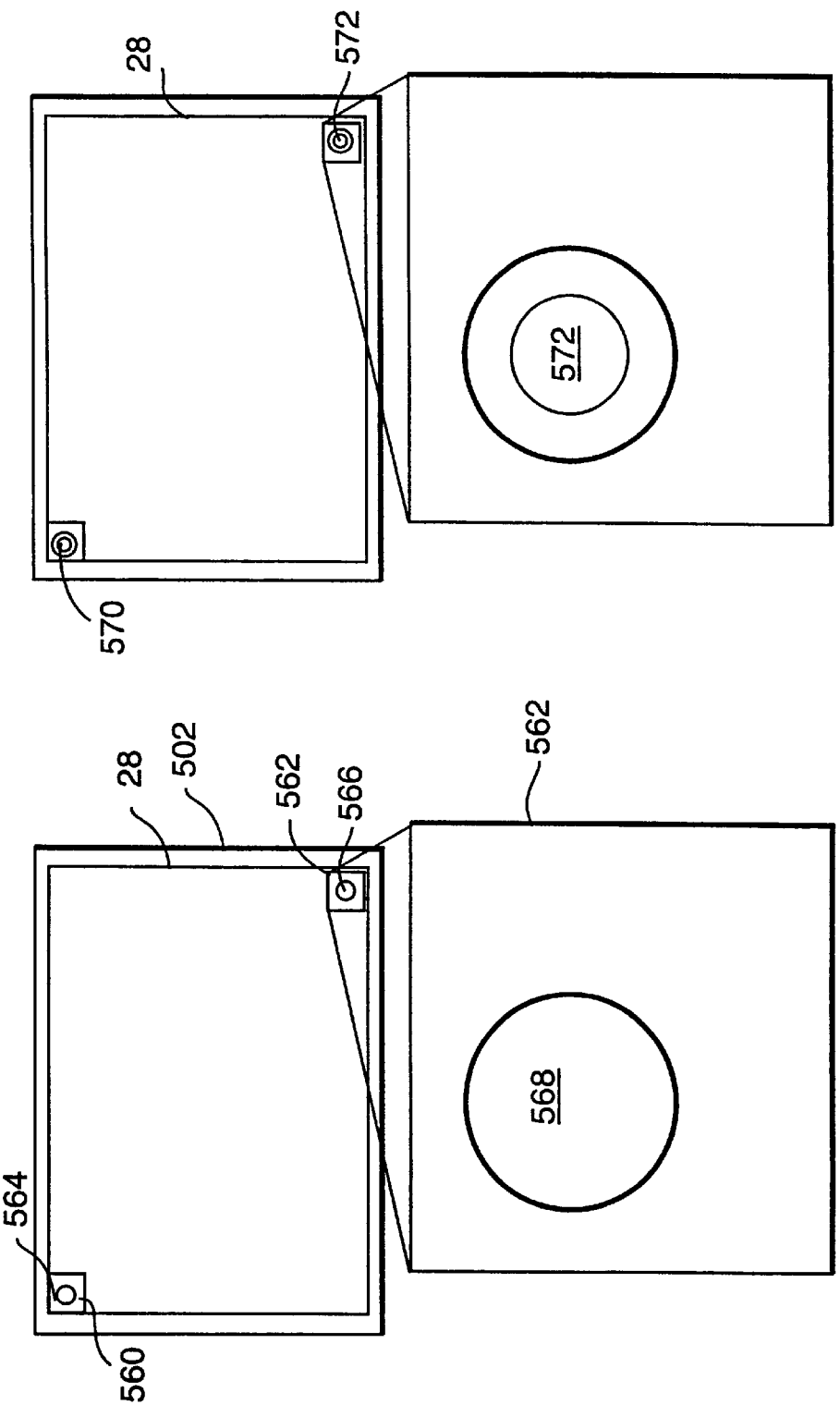
FIGS. 15A and 15B schematically illustrate the substrate and mask alignment processes of the present invention.

FIGS. 15A and 15B schematically illustrate the substrate alignment process of the invention. FIG. 15A illustrates a transparent substrate such as glass located over the top surface of the chuck 502. The substrate has two opaque patterned regions 560 and 562 formed in its opposite corners. At the center of each opaque region is a transparent circular region 564 and 566. As shown in the expanded view of the opaque region 562, a CCD pixel array 568 is exposed through each transparent circular region when the substrate 28 is properly aligned over the chuck 502.

FIG. 15B shows alignment of the mask pattern with the substrate 28. In FIG. 15B, the substrate 28 is illuminated with a mask pattern with light of a wavelength which does not react with the photoresist on the top surface of the substrate 28. The mask pattern projects circular dots 570 and 572 in opposite corners of the pattern. When the pattern is properly aligned over the substrate 28, the circular 570 and 572 should be located centrally within transparent regions 564 and 566, respectively, as shown in the blowup insert. The CCD pixels are read by the controller 522 (FIG. 11) to determine the relative location between the projected circular dots 570 and 572 and their corresponding circular regions 564 and 566, respectively, on the substrate 28. Based on the pixel data, the controller 522 generates alignment control signals which are sent to the six-leg hexapod 534 to move the chuck 502 and hence the substrate 28 to the proper location under the mask pattern.

It should be noted that shapes other than circular can be used for the regions 564 and 566. Also, the CCD pixel arrays can be optically coupled to the dots 570 and 572 by relay optics which can magnify the CCD elements.

While this invention has been particularly shown and described with references to preferred embodiments thereof, it will be understood by those skilled in the art that various changes in form and details may be made therein without departing from the spirit and scope of the invention as defined by the appended claims.

The invention claimed is:

1. A photolithography system comprising:
   a light source;
   illumination optics for illuminating a mask with light from the light source; and
   projection optics for receiving light transmitted through the mask and projecting an enlarged image of the mask onto a surface of a substrate, the projection optics including at least one optical element having an aspheric shaped surface described by a polynomial for a conic section with a plurality of additional terms defining non-zero surface deformations from the conic section shape.

2. The photolithography system of claim 1 wherein the image is projected at a resolution of less than 10 $\mu$m.

3. The photolithography system of claim 1 wherein the substrate is a flat panel for a flat panel display.

4. The photolithography system of claim 1 wherein the substrate is a semiconductor wafer.

5. The photolithography system of claim 1 wherein the projection optics include at least one reflective optical element and at least one refractive optical element.

6. The photolithography system of claim 1 wherein the projection optics include at least one optical element having an aspheric surface.

7. The photolithography system of claim 1 wherein the projection optics comprise at least one optical element having an optical surface of unusual shape.

8. The photolithography system of claim 1 wherein the projection optics include at least four mirrors.

9. The photolithography system of claim 8 wherein each of the four mirrors comprises an optical surface of unusual shape.

10. A photolithography system of claim 1 wherein the projection optics are telecentric at the surface of the substrate.

11. The photolithography system of claim 1 further comprising an adjustable substrate holder for holding the substrate and being adjustable to control the shape of the surface of the substrate.

12. The photolithography system of claim 11 further comprising a sensor for sensing the shape of the surface of the substrate.

13. The photolithography system of claim 12 wherein the sensor comprises a diffractive optical element for generating a Moire pattern.

14. The photolithography system of claim 11 wherein the adjustable substrate holder is adjustable to flatten the surface of the substrate.

15. The photolithography system of claim 1 further comprising an alignment system for aligning the surface of the substrate with the image of the mask.

* * * * *